United States Patent
Yasui et al.

(10) Patent No.: US 7,081,303 B2
(45) Date of Patent: Jul. 25, 2006

(54) FUNCTION DEVICE AND METHOD FOR MANUFACTURING THE SAME, PERPENDICULAR MAGNETIC RECORDING MEDIUM, MAGNETIC RECORDING/REPRODUCTION APPARATUS AND INFORMATION PROCESSING APPARATUS

(75) Inventors: Nobuhiro Yasui, Kanagawa (JP); Tohru Den, Tokyo (JP); Kazuhiko Fukutani, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/656,242

(22) Filed: Sep. 8, 2003

(65) Prior Publication Data

US 2004/0048092 A1 Mar. 11, 2004

Related U.S. Application Data

(63) Continuation of application No. PCT/JP03/02901, filed on Mar. 12, 2003.

(30) Foreign Application Priority Data

| Mar. 15, 2002 | (JP) | ............................ 2002-073111 |
| Mar. 15, 2002 | (JP) | ............................ 2002-073112 |
| Mar. 15, 2002 | (JP) | ............................ 2002-073113 |
| Mar. 29, 2002 | (JP) | ............................ 2002-096422 |
| May 28, 2002 | (JP) | ............................ 2002-153687 |
| Dec. 13, 2002 | (JP) | ............................ 2002-363163 |

(51) Int. Cl.
*B32B 9/04* (2006.01)

(52) U.S. Cl. .................. 428/446; 428/450; 428/688; 428/699; 428/701

(58) Field of Classification Search ............. 428/411.1, 428/446, 450, 688, 699, 701
See application file for complete search history.

(56) References Cited

U.S. PATENT DOCUMENTS 5,244,828 A 9/1993 Okada et al. .................. 437/81

(Continued)

FOREIGN PATENT DOCUMENTS

JP 52-78403 7/1977

(Continued)

OTHER PUBLICATIONS

C.D. Adams, et al. "Monte Carlo Simulation of Phase Separation During Thin-Film Codeposition," J. Appl. Phys. 74(3), Aug. 1, 1993, American Institute of Physics, pp. 1707-1715.

(Continued)

*Primary Examiner*—Holly Rickman
(74) *Attorney, Agent, or Firm*—Fitzpatrick, Cella, Harper & Scinto

(57) ABSTRACT

With regard to a function device formed by filling a porous structure with a functional material and a method for manufacturing the functional device, a technique for realizing a structure on a nanometer scale is not fully established. However, a method for manufacturing a function device characterized by including a step of providing a structure including columnar members and an area surrounding the columnar members, a step of removing the columnar members from the structure to form a porous body and a step of filling the porous body with a functional material allows various types of function device to be provided.

19 Claims, 17 Drawing Sheets

U.S. PATENT DOCUMENTS

| | | | | |
|---|---|---|---|---|
| 6,027,796 | A | 2/2000 | Kondoh et al. | 428/312.8 |
| 6,602,620 | B1 * | 8/2003 | Kikitsu et al. | 428/694 T |
| 6,610,463 | B1 | 8/2003 | Ohkura et al. | 430/322 |
| 2001/0036563 | A1 | 11/2001 | Watanabe et al. | 428/694 T |
| 2002/0031008 | A1 | 3/2002 | Den et al. | 365/173 |
| 2002/0086185 | A1 | 7/2002 | Yasul et al. | 428/694 TS |
| 2004/0001964 | A1 | 1/2004 | Ohkura et al. | 428/596 |
| 2004/0033339 | A1 | 2/2004 | Fukutani et al. | 428/137 |
| 2004/0043208 | A1 | 3/2004 | Fukutani et al. | 428/304.4 |
| 2005/0053773 | A1 | 3/2005 | Fukutani et al. | 428/209 |

FOREIGN PATENT DOCUMENTS

| | | |
|---|---|---|
| JP | 62-270473 | 11/1987 |
| JP | 63-220411 | 9/1988 |
| JP | 5-55545 | 3/1993 |
| JP | 7-73429 | 3/1995 |
| JP | 09-0157062 A | 6/1997 |
| JP | 01-101644 | 4/2001 |
| JP | 2001-261376 | 9/2001 |
| JP | 01-273622 | 10/2001 |

OTHER PUBLICATIONS

C.D. Adams, et al. "Transition from Lateral to Transverse Phase Separation During Film Co-deposition," Appl. Phys. Lett. 59 (20), Nov. 11, 1991, American Institute of Physics, pp. 2535-2537.

C.D. Adams, et al. "Phase Separation During Co-deposition of Al-Ge Thin Films," J, Mater. Res., vol. 7, No. 3, Mar. 1992, Materials Research Society, pp. 653-667.

M. Atzmon, et al. "Phase Separation During Film Growth," J. Appl. Phys. 42 (2), Jul. 15, 1992, American Institute of Physics, pp. 442-446.

M. Jacobs, et al. "Unbalanced Magnetron Sputtered Si-Al Coatings: Plasma Conditions and Film Properties Versus Sample Bias Voltage," Surface and Coatings Technology 116-119 (1999) pp. 735-741.

* cited by examiner

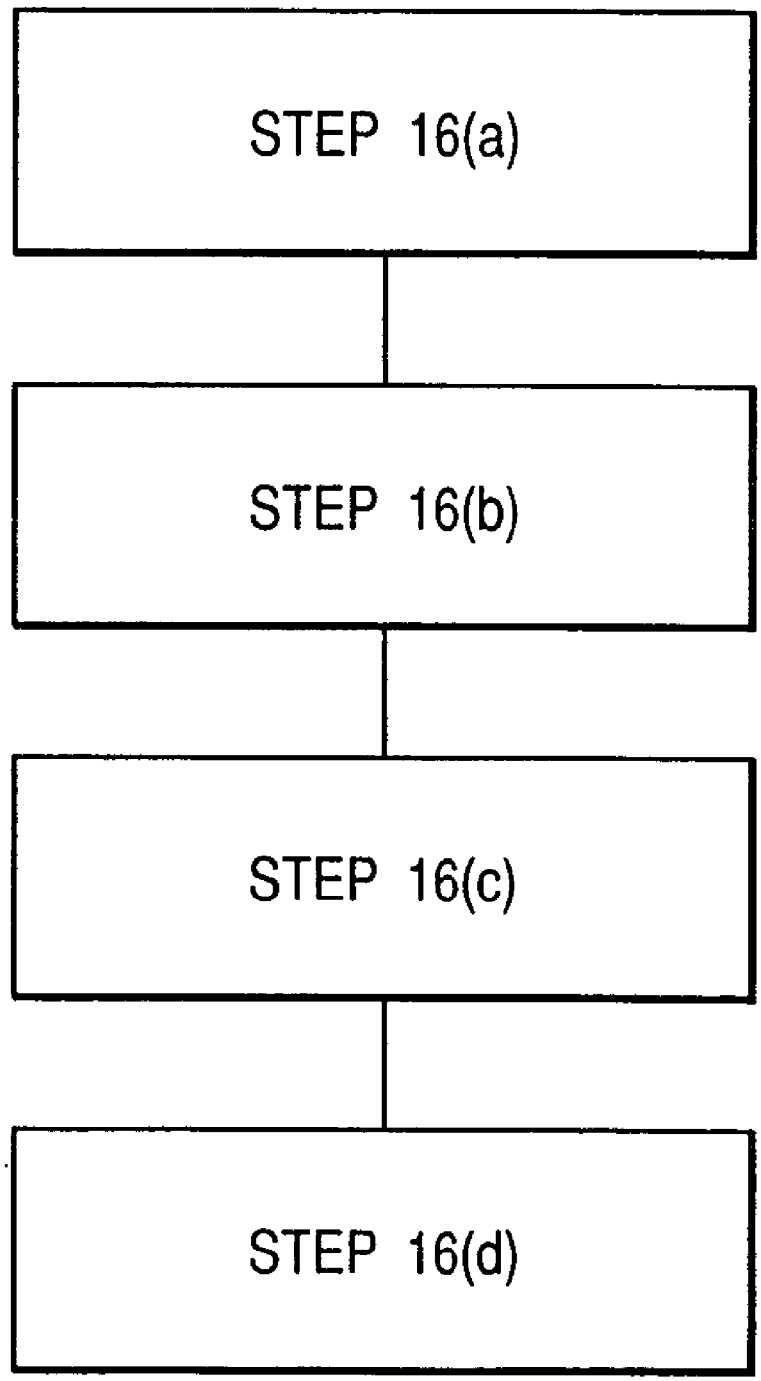

FUNCTION DEVICE AND METHOD FOR MANUFACTURING THE SAME, PERPENDICULAR MAGNETIC RECORDING MEDIUM, MAGNETIC RECORDING/REPRODUCTION APPARATUS AND INFORMATION PROCESSING APPARATUS

This application is a continuation of International Application No. PCT/JP03/02901, filed Mar. 12, 2003, which claims the benefit of Japanese Patent Application Nos. 2002-073111 filed on Mar. 15, 2002, 2002-073112 filed on Mar. 15, 2002, 2002-073113 filed on Mar. 15, 2002, 2002-096422 filed on Mar. 29, 2002, 2002-153687 filed on May 28, 2002 and 2002-363163 filed on Dec. 13, 2002.

BACKGROUND OF THE INVENTION

1. Field of the Invention

The present invention relates to a function device formed by filling a porous structure (porous body) with a functional material and a method for manufacturing the same, and more specifically, to an electronic device, optical device and recording device, etc.

2. Related Background Art

There is a growing interest in microstructures as components of function devices in recent years. One of techniques for creating such microstructures is a technique for directly creating microstructures using a semiconductor processing technology represented by a fine patterning technology such as photolithography (for example, see patent document 1, that is, Japanese Patent Application Laid-Open No. 5-55545 (p. 3, FIG. 1)).

Furthermore, in addition to the above-described semiconductor processing technology, there is a technique of using self-organization phenomenon of a material. That is, it is a technique for realizing a new microstructure on the basis of a naturally formed ordered structure.

The technique using this self-organization phenomenon or self-formation phenomenon has a possibility of realizing structures on not only a micrometer scale but also a nanometer scale, and therefore many investigations are being carried out on this technique. However, this technique cannot be said to be well-established and the fact is that there is a demand for provision of a new microstructure or establishment of its manufacturing method.

Thus, it is an object of the present invention to provide a new structure which can be components for a function device, a function device using such a new structure and a method for manufacturing such a function device, etc.

SUMMARY OF THE INVENTION

The method for manufacturing a function device according to the present invention is characterized by including a step of preparing a structure including columnar members and an area surrounding the columnar members, a step of removing the columnar members from the structure and forming a porous body and a step of filling the porous body with a functional material.

Here, in the above-described structure, the columnar members comprised of a first material are surrounded by the area comprised of a second material and the proportion of the second material to the total amount of the first material and the second material in the structure may be in the range from 20 atomic % to 70 atomic %.

Furthermore, the diameter of the columnar member may also be 50 nm or less or the center-to-center distance between the columnar members may be 30 nm or less.

The first material may be aluminum and the second material may be silicon or a mixture of silicon and germanium.

The aforementioned functional material refers to, for example, a conductive material, magnetic material, luminescent material and semiconductor material. Furthermore, the length in the depth direction of columnar pores of the porous body may also be substantially equal to the thickness of the area surrounding the pores.

Furthermore, the function device according to the present invention is characterized by being obtained from a structure comprised of columnar members and an area surrounding the columnar members by filling a porous body obtained by removing the columnar members from the structure with a functional material.

In the structure, the columnar members comprised of the first material may also be surrounded by the area comprised of the second material and the proportion of the second material to the total amount of the first material and the second material in the structure may be in the range from 20 atomic % to 70 atomic %.

The length in the depth direction of columnar pores of the porous body may be substantially equal to the thickness of the area surrounding the pores.

Furthermore, the function device according to the present invention is a function device obtained by filling a porous body with a functional material, characterized in that the porous body includes a plurality of columnar pores and an area surrounding the pores, and the area is an amorphous area comprised of C, Si, Ge or a combination of these materials.

Here, the amorphous area may also be an area including oxide. The entire porous body may be oxide or instead of the entire porous body, the wall side of the pore may be composed mainly of oxide.

According to the present invention, the columnar pores may have a structure with substantially no branches.

The average distance between centers of the plurality of pores is preferably 30 nm or less or the diameter of the columnar pore is preferably 20 nm or less.

According to the present invention, the plurality of pores may have substantially the same depth direction.

Here, the oxide amorphous area may also include aluminum. Furthermore, the porous body is formed on a substrate and the depth direction of the columnar pores is also preferably quasi-perpendicular to the substrate.

Furthermore, the perpendicular magnetic recording medium according to the present invention is a magnetic recording medium having a base layer and recording layer on a substrate, characterized in that the recording layer is constructed by including columnar members comprised of a magnetic material, an area comprised of silicon, SiGe, or their oxides and surrounding the columnar members, and the base layer has a square crystalline array in the in-plane direction of the substrate and the columnar members include a hard magnetic material portion made up of an $L1_0$-ordered structure which is c-axis-oriented in the direction perpendicular to the substrate.

The hard magnetic material portion made up of the $L1_0$-ordered structure of the columnar members may also be predominantly comprised of MPt (M=Co, Fe, Ni) The hard magnetic material portion made up of the $L1_0$-ordered structure may also include at least one element of Ag, Pd, Ir, Rh, Cu, Cr, P and B.

The columnar members excluding the hard magnetic material portion having the $L1_0$-ordered structure may also be a structure having a square crystalline array parallel to the plane of the substrate.

The columnar member excluding the hard magnetic material portion having the $L1_0$-ordered structure may also be an fcc structure or $L1_2$-ordered structure.

The fcc structure portion of the columnar members may also have a structure predominantly comprised of any one of precious metal, Cu and NiFe and the $L1_2$-ordered structure may also have a structure predominantly comprised of $M_3Pt$ (M=Fe, Ni) or $MPt_3$ (M=Co, Fe).

The $L1_2$-ordered structure portion of the columnar members may also be comprised of $Fe_3Pt$ or $FePt_3$.

The columnar members may also be provided with $L1_2$-ordered structure comprised of $Fe_3Pt/L1_0$-ordered structure comprised of FePt/base layer or $L1_0$-ordered structure comprised of $FePt/L1_2$-ordered structure comprised of $FePt_3$/base layer, in that order from the top layer to the base layer.

The layer comprised of silicon oxide having the micropores may consist of $(Al_xSi_{1-x})_yO_{1-y}$, where X may range from 0.01 to 0.2.

The average diameter of the columnar members filled in the micropores may range from 1 to 9 nm and the average distance may range from 3 to 10 nm.

The layer comprised of SiGe oxide having micropores may consist of $(Al_x(Si_yGe_{1-y})_{1-x})_zO_{1-z}$, where X may range from 0.01 to 0.2, and y may be in a range of 0<y<1.

The average diameter of the columnar member filled in the micropores may range from 1 to 15 nm and the average distance may range from 3 to 20 nm.

The base layer may also have an fcc structure, or any one of ordered structures $L1_0$, $L1_1$ and $L1_2$.

The base layer may also have an fcc structure predominantly comprised of any one of precious metal, Cu or NiFe, an $L1_0$-ordered structure predominantly comprised of MPt (M=Co, Fe, Ni), $L1_1$-ordered structure predominantly comprised of CuPt, or $L1_2$-ordered structure predominantly comprised of any one of $M_3Pt$ (M=Fe, Ni) or $MPt_3$ (M=Co, Fe).

The portions from the base layer to the columnar member may also be epitaxially grown.

An MgO (001) layer may also be placed below the base layer.

A soft magnetic material layer may also be placed below the base layer.

The micropores may also be arranged in a honeycomb array.

Furthermore, the present invention includes a magnetic recording/reproduction apparatus using the above-described perpendicular magnetic recording medium or an information processing apparatus using those apparatuses.

Furthermore, the method for manufacturing a perpendicular magnetic recording medium according to the present invention is a method for manufacturing a perpendicular magnetic recording medium having a base layer and a recording layer on a substrate, comprising a step of forming a base layer having a square crystalline array in the in-plane direction of the substrate, a step of forming a structure having columnar aluminum portions comprised of aluminum standing in the direction perpendicular to the substrate on the base layer, a silicon portion comprised of silicon placed in such a way as to surround the sides of the columnar aluminum portions and SiGe component or SiGe portion, a step of removing the columnar aluminum portions of the structure to form micropores and oxidizing the silicon portion or the SiGe portion, and a step of forming a portion predominantly comprised of MPt (M=Co, Fe, Ni) in the micropores by means of electrodeposition, then annealing and forming a recording layer provided with a columnar member including a hard magnetic material having an $L1_0$-ordered structure which is c-axis-oriented in the direction perpendicular to the substrate.

Furthermore, the perpendicular magnetic recording medium according to the present invention is a magnetic recording medium having a soft magnetic material layer and a recording layer on a substrate, characterized in that the soft magnetic material layer is constructed by including columnar soft magnetic materials and a non-magnetic material area surrounding the soft magnetic materials.

Here, the non-magnetic material may also include $Al_xSi_{1-x}$ (X=0.01 to 0.2) or its oxide as a main component.

The non-magnetic material may also include $Al_xSi_{1-x}$ (X=0.01 to 0.2) and a component material of the columnar soft magnetic material as main components.

Here, the average diameter of the columnar soft magnetic materials may also be 1 to 9 nm, the average distance may be 3 to 10 nm or the shape of the columnar soft magnetic materials may be cylindrical.

The columnar soft magnetic materials may also be comprised of NiFe.

A base layer made up of a single or 2 or more non-magnetic conductive films may also be provided between the substrate and the soft magnetic material layer.

A base layer made up of a single or 2 or more non-magnetic conductive films may also be provided between the soft magnetic material layer and the recording layer.

Furthermore, the method for manufacturing a perpendicular magnetic recording medium according to the present invention is a method for manufacturing a perpendicular magnetic recording medium having a substrate and a soft magnetic material layer and recording layer arranged on the substrate, characterized by including a step of forming columnar structure sections predominantly comprised of aluminum and a non-magnetic area predominantly comprised of silicon arranged in such a way as to surround the columnar structure sections on a substrate, and a step of forming a soft magnetic material layer by replacing the columnar structure sections predominantly comprised of aluminum by columnar soft magnetic materials.

Furthermore, the method for manufacturing a magnetic recording medium according to the present invention is characterized by comprising a first step of providing a structure made up of columnar members comprised of a first material and an area comprised of a second material surrounding the columnar structures, the proportion of the second material to the total amount of the first material and the second material in which is in the range from 20 atomic % to 70 atomic %, a second step of removing the columnar members from the structure and a third step of filling the porous body formed in the second step with a magnetic material.

Furthermore, the magnetic recording medium according to the present invention is a magnetic recording medium comprised of a substrate and a recording layer, characterized in that the recording layer is provided with columnar members comprised of a magnetic material and an area comprised of silicon, SiGe or oxide of these elements surrounding the columnar members.

The present invention can provide various function devices from a structure consisting of columnar members and an area surrounding the columnar members by filling a porous body obtained by removing the columnar members from the structure.

BRIEF DESCRIPTION OF THE DRAWINGS

FIG. 16 is a schematic view for illustrating a method for manufacturing a function device according to the present invention;

Figure 1:
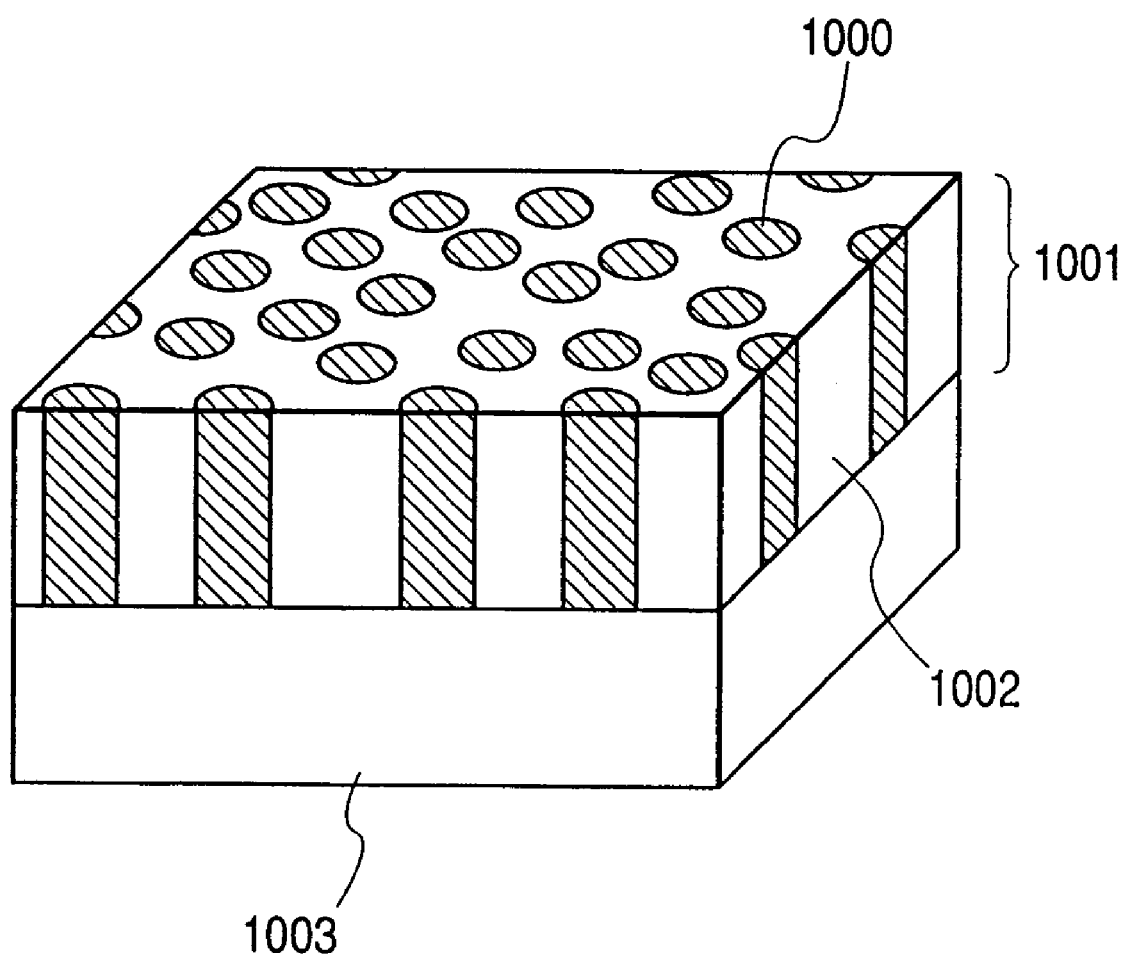
FIG. 1 is a schematic view of a structure comprised of columnar members and an area surrounding the columnar members applied to the present invention.

DETAILED DESCRIPTION OF THE PREFERRED EMBODIMENTS (1) Structure Having Columnar Members and Method for Manufacturing Structure First, a structure having columnar members applicable to the present invention will be explained using FIG. 1.

In the same figure, reference numeral 1000 denotes columnar members; 1002, an area surrounding the columnar members; 1001, a structure including them; and the figure shows the columnar members 1000 distributed in the area 1002. Reference numeral 1003 denotes a substrate.

According to the present invention, the columnar members are removed and pores resulting from the removal of the columnar members are filled with a functional material, and therefore it is important that the columnar member 1000 can be selectively removed from the structure 1001. Here, the selective removal only requires that the columnar members can be substantially removed, includes a case where an area surrounding the columnar members to be removed is also partially removed or further includes a case where the columnar members are not removed completely but part of the columnar members remains.

The structure 1001 in FIG. 1 consists of the columnar members 1000 comprised of a first material surrounded by the area 1002 comprised of a second material, and the structure preferably includes the second material to the total amount of the first material and the second material in the range from 20 atomic % to 70 atomic %. According to an investigation conducted by the present inventor et al., it is possible to realize a structure in which columnar members are substantially distributed in a matrix area surrounding them. Though it depends on the shape of the substrate of the base on which the structure is formed, if the substrate is horizontally oriented, the columnar members are arranged perpendicular to the substrate.

The above-described proportion refers to the proportion of the second material with respect to the total amount of the first material and the second material constituting the structure and is preferably 25 atomic % or above and 65 atomic % or less, or more preferably 30 atomic % or above and 60 atomic % or less. The above-described proportion is calculated by carrying out a quantitative analysis using, for example, an inductively coupled plasma emission spectrometry.

By the way, what is required is to realize a substantially columnar shape and for example, the second material may be included as a component of the columnar members or the first material may also be included in the above-described area. Furthermore, a trace of oxygen, argon, etc., may also be included in the columnar members and the surrounding area.

Here, examples of the first material include Al, Au, Ag, Mg, etc. Examples of the second material include a mixture of Si, Ge, Si and Ge (hereinafter described as "$Si_XGe_{1-X}$ (0<X<1)") and C, etc. It is especially desirable that a material that can become amorphous be used as the second material.

Furthermore, it is preferable that materials having a eutectic point (a so-called eutectic material) in a phase equilibrium chart of both components be used as the first and second material. Especially the eutectic point is preferably 300° C. or above or more preferably 400° C. or above.

By the way, a preferable combination for the first material and second material is a mode using Al as the first material and using Si as the second material or a mode using Al as the first material and using $Si_XGe_{1-X}$ (0<X<1) as the second material.

The above-described columnar members are preferably at least partially polycrystalline and the area surrounding the columnar members is preferably amorphous. When Si or SiGe is used as the second material, the area is mainly amorphous. The surface shape of the columnar members is circular or ellipsoidal.

The structure consists of a plurality of the columnar members distributed in a matrix comprised of the second material. The diameter of the columnar members (diameter when the surface shape is circular) is controllable mainly according to the composition of the structure (that is, the proportion of the second material), but the average diameter is 0.5 nm or above and 50 nm or less, or preferably 1 nm or above and 20 nm or less or more preferably 2 nm or above and 10 nm or less. The diameter is most preferably less than 20 nm. Here, the average diameter is a value calculated by applying image processing to the columnar portions observed from an actual SEM photograph (range of approximately 100 nm×100 nm) directly or using a computer. However, the optimum diameter and following distance can be changed depending on the material used, composition or use of the structure.

Furthermore, the center-to-center distance between the plurality of columnar members is 2 nm or above and 30 nm or less, or preferably 5 nm or above and 20 nm or less, or more preferably 5 nm or above and 15 nm or less. Of course, for the above-described 2R, a minimum necessary distance for preventing the columnar structures from colliding with each other must be secured as a lower limit of the center-to-center distance. By the way, using a mixture of a plurality of elements (for example, $Si_xGe_{1-x}$) as the above-described second material (that is, component material of the area surrounding the columnar members) also makes it possible to control the above-described center-to-center distance depending on the proportion of the mixing ratio.

Furthermore, the structure is preferably a film-shaped structure and in such a case, the columnar members are distributed in a matrix comprised of the second material in such a way as to be quasi-perpendicular to the in-plane direction of the film. The film thickness of the film-shaped structure is not particularly limited and is applicable within a range of 1 nm to 100 μm. Considering a process time, etc., a more realistic film thickness is on the order of 1 nm to 1 μm. Especially, it is preferable that the columnar structures be maintained even with a film thickness of 300 nm or above. Furthermore, the columnar members have a structure with substantially no branch in the thickness direction (longitudinal direction).

Since the length in the depth direction of the columnar members is substantially the same as the thickness of the area surrounding them, the length in the depth direction of columnar pores in the porous body obtained by removing the columnar members can be substantially the same as the thickness of the area surrounding the pores.

The structure is preferably a film-shaped structure and the structure may be provided on a substrate. The substrate (1003 in FIG. 1) is not particularly limited and it is possible to use a substrate comprised of an insulator or substrate having an insulating layer on the surface, insulating substrate such as quartz glass, semiconductor substrate such as silicon substrate, gallium arsenide, or indium phosphide, or metal substrate such as aluminum or a flexible substrate (for example, polyimide resin) if the above-described structure can be formed on the substrate as a supporting member. Furthermore, it is also possible to apply a carbon substrate, SOI substrate, P-type, N-type, high resistance, low resistance silicon substrate.

A method for manufacturing this structure 1001 will be explained. This explanation will use, for example, aluminum as the material composing the columnar members and silicon as the material composing the area surrounding the columnar members.

Figure 2:
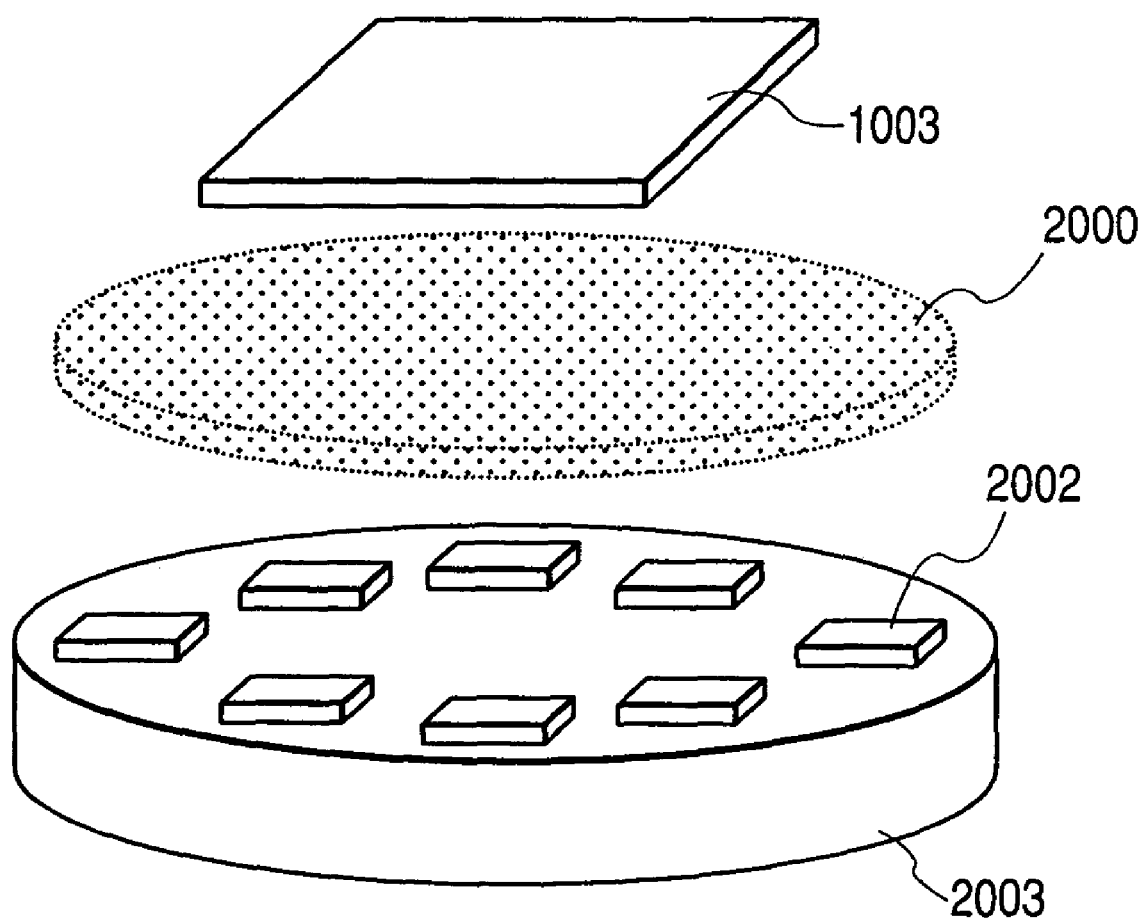
FIG. 2 schematically illustrates a method for manufacturing a structure applied to the present invention.

The structure according to the present invention can be created using a film formation method in a non-equilibrium state. A typical example thereof is film formation according to a sputtering method. More specifically, as shown in FIG. 2, when silicon pieces (silicon chips) 2002 are placed on a target substrate 2003 of aluminum in a sputtering apparatus and sputtering is performed in an argon atmosphere, a structure according to the present invention is formed on the surface of the substrate 1003. If the amount of silicon (second material) in the structure obtained by film formation is included at a proportion of 20 atomic % or above and 70 atomic % or less of the total amount of aluminum and silicon in the structure, a structure consisting of columnar members substantially distributed in a matrix area surrounding the columnar members is realized. By the way, reference numeral 2000 in FIG. 2 denotes Ar plasma.

As a film formation method, a sputtering method is preferably used and a film formation method for forming substances in a non-equilibrium state such as resistance heating vapor deposition, electron beam vapor deposition (EB vapor deposition) and ion plating method is applicable. As a sputtering method, a magnetron sputtering, RF sputtering, ECR sputtering or DC sputtering method can be used. When applying a sputtering method, it is recommendable to perform film formation by setting the pressure in a reactor in an argon atmosphere to approximately 0.2 to 1 Pa. During sputtering, the first material and second material may be prepared separately as target raw materials or a target material resulting from the first material and second material calcinated at a desired proportion beforehand may also be used. By the way, when performing the sputtering method, it is preferable to carry out sputtering especially in such a way that plasma does not contact the substrate itself in which a film grows.

Furthermore, the structure formed on the substrate is formed with the substrate temperature set to 300° C. or less or more preferably 20° C. or above and 200° C. or less and most preferably 100° C. or above and 150° C. or less.

(2) Next, the Proportions of the First Material (the First Material Constitutes the Columnar Members) and Second Material (the Second Material Constitutes the Area Surrounding the Columnar Members) in the Structure Applicable to the Present Invention will be Explained.

The porous body according to the present invention is now available because the efforts of the present inventor et al. has come to fruition as the structure which will be described hereunder. This will be explained using FIG. 2 in the same way as described above.

On the glass substrate 1003, an aluminum-silicon mixed film of approximately 200 nm in thickness (that is, structure applicable to the present invention) containing silicon of 55 atomic % of the total amount of aluminum and silicon is formed using an RF magnetron sputtering method.

The target used is eight silicon chips 2002 of 15 mm per side placed on a 4-inch aluminum target as shown in FIG. 2. As the sputtering conditions, an RF power supply is used with Ar flow rate: 50 sccm, discharge pressure: 0.7 Pa, power supplied: 1 kW. Furthermore, the substrate temperature was set to a room temperature.

By the way, eight silicon chips 2002 placed on the aluminum target were used as the target 2003 here, but the number of silicon chips is not limited to this and it is changed depending on the sputtering condition and is acceptable if the composition of the aluminum-silicon mixed film is close to approximately 55 atomic %. Furthermore, the target is not limited to the silicon chips placed on the aluminum target, but it is also possible to use aluminum chips placed on a silicon target or use a target with sintered silicon and aluminum powder.

Next, from the aluminum-silicon mixed film obtained in this way, the amount of silicon (atomic %) with respect to the total amount of aluminum and silicon was analyzed using an ICP (inductively coupled plasma emission spectrometry). As a result, the amount of silicon with respect to the total amount of aluminum and silicon was approximately 55 atomic %. By the way, for convenience of measurement, an aluminum-silicon mixed film stacked on a carbon substrate was used as the substrate here.

The aluminum-silicon mixed film was observed using an FE-SEM (field emission scanning electron microscope). Circular aluminum nano-structures surrounded by silicon were arranged two-dimensionally. The diameter of the aluminum nano-structure portion was 3 nm and the average center-to-center distance was 7 nm. Furthermore, when the cross-section was observed using the FE-SEM, the height was 200 nm and the respective aluminum nano-structures were independent of one another.

Furthermore, when this sample was observed using an X-ray diffraction method, no peak of silicon exhibiting crystallinity was confirmed and silicon was amorphous. By the way, a plurality of peaks exhibiting aluminum crystallinity were observed and at least part of aluminum was confirmed to be polycrystalline.

Thus, it was possible to create an aluminum-silicon nano-structure including an aluminum nano-wire with distance 2R of 7 nm surrounded by silicon, diameter 2r of 3 nm and height L of 200 nm.

In this way, the present inventor et al. discovered that by forming an aluminum-silicon mixed film using a film formation method for forming substances in a non-equilibrium state such as a sputtering method, it is possible to form an aluminum-silicon nano-structure containing aluminum nano-structures such as aluminum quantum dots or aluminum quantum nano-wires, etc., on the scale of several nm within a silicon matrix on the surface of the substrate.

COMPARATIVE EXAMPLE

Furthermore, as a comparative sample A, an aluminum-silicon mixed film including silicon of 15 atomic % with respect to the total amount of aluminum and silicon was formed approximately 200 nm in thickness on a glass substrate using the sputtering method. As the target, two silicon chips 2002 of 15 mm per side placed on a 4-inch aluminum target were used. As the sputtering conditions, an RF power supply was used with Ar flow rate: 50 sccm, discharge pressure: 0.7 Pa, power supplied: 1 kW. Furthermore, the substrate temperature was set to a room temperature.

The comparative sample A was observed using the FE-SEM (field emission scanning electron microscope). When viewed from right above the substrate, the surface of the aluminum portion was not circular and, aluminum pieces were connected with one another continuously. That is, it was not a microstructure formed with the aluminum columnar structures uniformly distributed in the silicon area. Furthermore, its size was by far greater than 10 nm. Moreover, when the cross-section was observed using the FE-SEM, the width of the aluminum portion was beyond 15 nm. The aluminum-silicon mixed film obtained in this way was analyzed using an ICP (inductively coupled plasma emission spectrometry) to calculate the amount of silicon (atomic %) with respect to the total amount of aluminum and silicon. The result showed that the amount of silicon with respect to the total amount of aluminum and silicon was approximately 15 atomic %.

Furthermore, as a comparative sample B, an aluminum-silicon mixed film containing silicon of 75 atomic % of the total amount of aluminum and silicon was formed approximately 200 nm on a glass substrate using the sputtering method. As the target, 14 silicon chips 2002 of 15 mm per side were placed on a 4-inch aluminum target. As the sputtering condition, an RF power supply was use with Ar flow rate: 50 sccm, discharge pressure: 0.7 Pa and power supplied: 1 kW. Furthermore, the substrate temperature was set to a room temperature.

A comparative sample B was observed using the FE-SEM (field emission scanning electron microscope). No aluminum portion was observed on the surface of the sample seen from right above the substrate. Moreover, though the cross-section was observed using the FE-SEM, the aluminum portions could not be observed clearly. By the way, the aluminum-silicon mixed film obtained in this way was analyzed using an ICP (inductively coupled plasma emission spectrometry) to calculate the amount of silicon (atomic %) with respect to the total amount of aluminum and silicon. The result showed that the amount of silicon with respect to the total amount of aluminum and silicon was approximately 75 atomic %.

Furthermore, based on the comparative sample A, samples were prepared by changing the condition of only the number of silicon chips with the proportions of silicon with respect to the total amount of the aluminum-silicon mixture set to 20 atomic %, 35 atomic %, 50 atomic %, 60 atomic % and 70 atomic %, respectively. A microstructure with the aluminum columnar structures distributed within the silicon area is indicated with o, while a microstructure with the aluminum columnar structures not distributed within the silicon area is indicated with x below. By the way, from the standpoint of uniformity of the columnar structures, the proportion of silicon is preferably 30 or above 60 atomic %. On the other hand, when the proportion of silicon is 65 or 70 atomic %, aluminum crystallinity was low and aluminum was almost amorphous.

TABLE 1

| Proportion of silicon (atomic %) | Microstructure |
| --- | --- |
| 15 (Comparative sample A) | x |
| 20 | o |
| 25 | o |
| 35 | o |
| 50 | o |
| 55 | o |
| 60 | o |
| 65 | o |
| 70 | o |
| 75 (Comparative sample B) | x |

Thus, by adjusting the content of silicon with respect to the total amount of aluminum and silicon to 20 atomic % or above and 70 atomic % or less, it is possible to realize a structure in which aluminum columnar structures are distributed in the silicon area. By changing the composition of aluminum and silicon, it is possible to control the diameter of the columnar structures and create aluminum nano-wires with excellent linearity. Furthermore, a TEM (transmission electron microscope), etc., can also be used to confirm the structure in addition to an SEM.

Furthermore, as a comparative sample C, an aluminum-silicon mixed film including silicon of 55 atomic % with respect to the total amount of aluminum and silicon was formed approximately 200 nm in thickness on a glass substrate using the sputtering method. As the target, eight silicon chips 2002 of 15 mm per side placed on a 4-inch aluminum target were used. As the sputtering conditions, an RF power supply was use with Ar flow rate: 50 sccm, discharge pressure: 0.7 Pa, power supplied: 1 kW. Furthermore, the substrate temperature was set to 350° C.

The comparative sample C was observed using the FE-SEM (field emission scanning electron microscope). When viewed from right above the substrate, a large aluminum block was observed. Furthermore, by means of an X-ray diffraction measurement, it was confirmed that silicon was crystallized. That is, no aluminum nano-structure having a columnar structure was observed and the silicon area was not amorphous but crystallized. That is, when the substrate temperature is too high, silicon changes into a more stable state and this seems to be the reason why the film was not grown to form such aluminum nano-structures.

By the way, to obtain a structure with distributed columnar members, it is also a preferable mode to set the target composition to Al:Si=55:45, etc.

The case where aluminum was used as the first material and silicon was used as the second material was explained, but similar results were obtained also when the aforementioned materials applicable as the first and second materials were used.

A porous body is formed by selectively removing the columnar members from the above-described structure. The removal of the columnar members can be performed through etching or anodization, etc. Oxidation processing can also be performed after micropores are formed, or simultaneously with the formation of micropores. By the way, when, for example, aluminum is used as the first material, the content of the first material (for example, aluminum) included in the porous body obtained is in the range 0.01 to 20 atomic % for all elements except oxygen and is preferably in the range 0.1 to 10 atomic %.

(3) Filling Porous Body with Functional Material

First Embodiment

Function Device

A porous body is formed by removing the columnar members 1000 from the above-described structure 1001. The above-described porous body can be obtained because the present invention allows a combination of the first material composing the columnar members and the second material composing the surrounding area in such a way that a sufficient selection ratio is secured for the removal. As the removal method, wet etching, dry etching, or anodization processing, etc., are available. An example of preferable combination of materials is aluminum as the first material and silicon as the second material (or a mixture of silicon and germanium). In the case of wet etching, acids such as phosphoric acid, hydrochloric acid, sulfuric acid, etc., are preferred. If the selection ratio is secured, alkali, etc., can also be used.

By the way, the area 1002 in which the porous body is formed can also be subjected to oxidation processing or nitriding processing before the removal of the columnar members 1000 from the structure, during the removal or after the removal as required. Furthermore, it is also possible to perform processing to expand the micropores after the micropores are formed. This allows the diameter of the micropores to be controlled.

The pores of the porous body produced by removing the columnar members are filled with a functional material. Here, as the functional material, a variety of functional materials can be selected such as conductive material, magnetic material, luminescent material, semiconductor material, insulating material, depending on what kind of function device should be formed. By the way, filling the inside of the porous body according to the present invention includes not only complete filling with a desired material but also filling up to a desired depth instead of the entire depth in the depth direction of pores or coating of mainly the surface of the inner walls of the pores with the above-described functional material as required. By the way, it is also possible to place a pattern formation member such as a mask on the top surface of the porous body and separate the plurality of micropores into portions to be filled and portions not to be filled.

Before the porous body is formed from the above-described structure 1001, the pores of the porous body are filled with the columnar members 1000 and it is desirable to use a functional material used for the filling after the formation of the porous body, which is different from the component material of the above-described columnar members.

As the method for filling the porous body with the functional material, a vapor deposition method, CVD method, sputtering method, electrodeposition method or plating method, etc., is available.

Function devices are realized by filling various functional materials in this way. If a magnetic recording material is used as the function material, a recording device is realized, if a conductive material such as metal is used, not only a conductive member such as an electrode but also an electronic device such as quantum dot, quantum nano-wire, quantum nano-wire transistor, mono-electron transistor or mono-electron memory is realized. Light emitting devices can be realized by filling a luminescent material. Of course, it is also possible to fill a plurality of types of materials during the filling. With respect to the size, preferable sizes are defined depending on various devices, but the average pore diameter of the pores of the above-described porous body is preferably 20 nm or less and the average distance between the micropores is preferably 30 nm or less.

This embodiment will be explained in three cases; (A) where the porous body obtained by removing the columnar members from the above-described structure 1001 is filled with the functional material, (B) where the porous body obtained by applying oxidation processing after the removal (or during the removal) is filled with the functional material, and (C) where the removal step is performed through anodization and the porous body obtained there is filled with the functional material.

(A) The porous body obtained by etching and removing the columnar members from the above-described structure contains micropores on a nanometer scale. Using a technology of filling the inside of nano-holes with metal and semiconductor, etc., or a nano-holes replica technology makes it possible to provide various devices such as a coloration, magnetic recording medium, EL light-emitting element, electrochromic element, optical element, solar cell, gas sensor, or even a quantum effect device such as quantum nano-wire and MIM element.

By the way, the structure with very high density micropores created perpendicular to the substrate is important to applications for devices using quantum effects or manufacturing of an ultra-high-density recording medium. For example, it is possible to form nano-holes having a pore diameter of 10 nm or less at intervals of 15 nm or less and form an electric conduction material such as metal or semiconductor therein and thereby apply it to quantum effect devices such as mono-electron memory and mono-electron transistor.

Furthermore, filling the micropores of the silicon nano-structure according to this embodiment with a conductive material allows it to be applied to mono-electron memory, mono-electron transistor, etc., using quantum effects. Furthermore, filling the micropores with a magnetic material allows it to be used as a magnetic recording medium (the magnetic recording medium referred to here can be applied for a recording medium used in a longitudinal recording system or perpendicular system for magnetic recording but also for a photomagnetic recording medium. The same thing will apply hereafter). For example, the silicon nano-structure of the present invention itself is usable as a function material such as a light-emitting device, optical device and micro device.

A schematic view of a mono-electron memory will be explained using FIG. 19 below. This shows a case where the columnar members are removed from the above-described structure 1001 and the holes are filled with a conductive material, for example, aluminum, gold, platinum or copper.

Reference numeral 2191 denotes a substrate, 2192, an insulator (for example, silicon oxide); 2193, a structure in which columnar conductive materials are distributed, for example, in silicon; 2194, a drain area; 2195, a gate insulating area; 2196, a gate electrode; and 2197, a source area.

Figure 19:
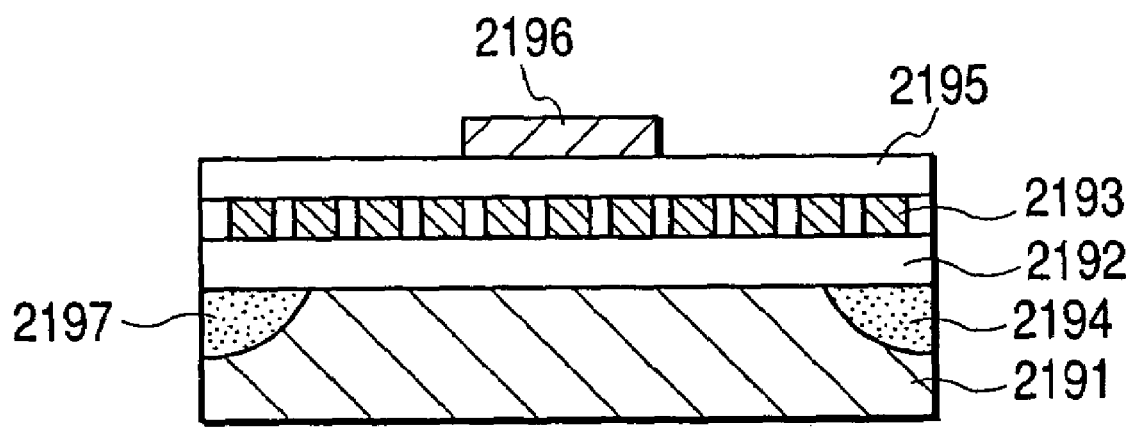
FIG. 19 is a schematic view for illustrating a function device according to the present invention.

As shown in FIG. 19, use of aluminum as quantum dots makes it possible to control the electrical characteristic of the channel section through influences of electric charge stored in quantum dots. Furthermore, the quantum dots can store electric charge for a long time, and therefore it is possible to form a non-volatile memory without its information being erased when its power supply is turned off. By the way, if a structure having distributed columnar members is available, other materials can also be used.

Thus, it is also possible to use this embodiment as a mono-electron memory, etc., using quantum effects or as a mono-electron transistor using similar principles.

(B) The following is an explanation of a case where a functional material is filled to manufacture a function device when the porous body is subjected to oxidation processing (of course, it may also be insulated through nitriding processing, etc.).

Using a technology of filling the inside of nano-holes of the porous body with metal or semiconductor or using a replica technology of nano-holes makes it possible to provide a coloration, magnetic recording medium, EL light-emitting element, electrochromic element, optical element, solar cell, gas sensor, or further quantum effect devices such as quantum nano-wire, MIM element, etc.

For example, it is possible to form nano-holes having a pore diameter of 10 nm or less at intervals of 15 nm or less and form an electric conduction material such as metal or semiconductor therein, and thereby apply it to quantum effect devices such as mono-electron memory and mono-electron transistor. Furthermore, filling with the magnetic material metal allows it to be used as an ultra-high-density recording medium, too.

Since the average pore diameter of micropores is 10 nm or less or preferably 1 to 9 nm and the average distance is 15 nm or less or preferably 3 to 10 nm, the quantum effects can be observed sufficiently even at a room temperature and the range of application of a nano-structure to devices can be further expanded. Furthermore, since silicon oxide is used as a material composing a nano-structure, when the inside of micropores is filled with an electric conduction material or semiconductor material, both parts are electrically insulated from each other, and therefore it is possible to expect observation of a tunnel current, coulomb blockade, expansion of a band gap, quantum effects such as discreteness of energy levels, thus further expanding the range of application of nano-structures to devices.

Furthermore, the silicon oxide nano-structure according to this embodiment has no film such as an insulator formed in the lower part of the micropores, and therefore it is possible to directly connect the substrate and micropores. Furthermore, filling the micropores of the silicon oxide nano-structure of the present invention with a conductive material allows the structure to be used as a mono-electron memory, mono-electron transistor, etc., using quantum effects. Furthermore, filling the micropores with magnetic materials allows the structure to be used as a high density recording medium, too.

Furthermore, the present invention allows micropores in silicon oxide to be used in various modes and expands its application range considerably. For example, the silicon oxide nano-structure of the present invention itself can be used as a function material such as a light-emitting device, optical device or micro device, etc.

(C) The following is an explanation of a case where a porous body is formed, when columnar members are removed from the above-described structure, through anodization processing and the inside of the porous body is filled with a functional material.

Using a technology of filling the inside of nano-holes of the porous body obtained through anodization with metal or semiconductor or using a replica technology of nano-holes makes it possible to provide a coloration, magnetic recording medium, EL light-emitting element, electrochromic element, optical element, solar cell, gas sensor, or further quantum effect devices such as quantum nano-wire, MIM element, etc.

For example, it is possible to form nano-holes having a diameter of 10 nm or less at intervals of 15 nm or less and form an electric conduction material such as metal or semiconductor therein, and thereby apply it to quantum effect devices such as a mono-electron memory and mono-electron transistor. Furthermore, filling the nano-holes with the magnetic material metal allows it to be used as an ultra-high-density recording medium, too.

Furthermore, filling the micropores of the silicon oxide nano-structure according to this embodiment with a conductive material allows it to be used as a mono-electron memory, mono-electron transistor, etc., using quantum effects. Furthermore, filling the micropores with a magnetic material allows it to be used as a high density recording medium, too. Furthermore, this embodiment allows micropores in silicon oxide to be used in various modes, thus significantly expanding its application range.

By the way, the aforementioned materials can be used as materials for a structure to form a porous body, that is, a structure having columnar members.

Examples of the first material composing the columnar members include Al and Au. Examples of the second material include Si, Ge, a mixture of Si and Ge (hereinafter described as "$Si_XGe_{1-X}$ (0<X<1)") and C. It is especially desirable that a material that can become amorphous be used as the second material. By the way, the embodiment which will be described later will explain a case where Al and Si are mainly used, but the present invention is not limited to these materials.

Second Embodiment

Orientation Base+AlSi or AlSiGe, etc.

Hereunder, a magnetic recording device (more specifically, magnetic recording medium), magnetic recording/reproduction apparatus and information processing apparatus using the magnetic recording/reproduction apparatus as function devices will be explained.

First, a magnetic recording device will be explained briefly.

With drastic expansion of information processing in recent years, there is a demand for drastic increases in capacities of information recording technologies such as magnetic disk apparatuses. With regard to hard disks in particular, the amount of recording information per unit area is increasing on a pace beyond an annual rate of 60%. The increase in the amount of recording information is further expected in the future, and miniaturization and higher density are also expected for portable recording apparatuses, etc.

A conventional magnetic recording medium for a hard disk adopts a horizontal magnetic recording system and magnetization is recorded in parallel to the surface of the disk. According to this horizontal magnetic recording system, as densities are increased, it is necessary to reduce the thickness of the magnetic recording layer to suppress the dimagnetic domain in the magnetic domain and extend the magnetic field above the medium to detect the magnetization state. This reduces a volume per one magnetic grain significantly, resulting in a tendency to increase the likelihood of a superparamagnetism effect. That is, the energy that stabilizes the magnetization direction becomes smaller than thermal energy and the recorded magnetization varies with time, causing the record to disappear. For this reason, studies on replacing the horizontal magnetic recording system by a perpendicular magnetic recording system which allows a greater film thickness of the recording layer are being actively conducted in recent years.

As perpendicular magnetic recording media, there are proposals of a type of media using a single magnetic recording layer and a double-layer type of media using a soft magnetic material layer with high magnetic permeability as a backing layer with a hard magnetic recording layer placed thereon. The latter adopts a configuration of a magnetic circuit that concentrates the magnetic field from the perpendicular magnetic head on the recording layer, leads the magnetic field through the soft magnetic material layer horizontally and returns it to the head side.

Figure 13A:
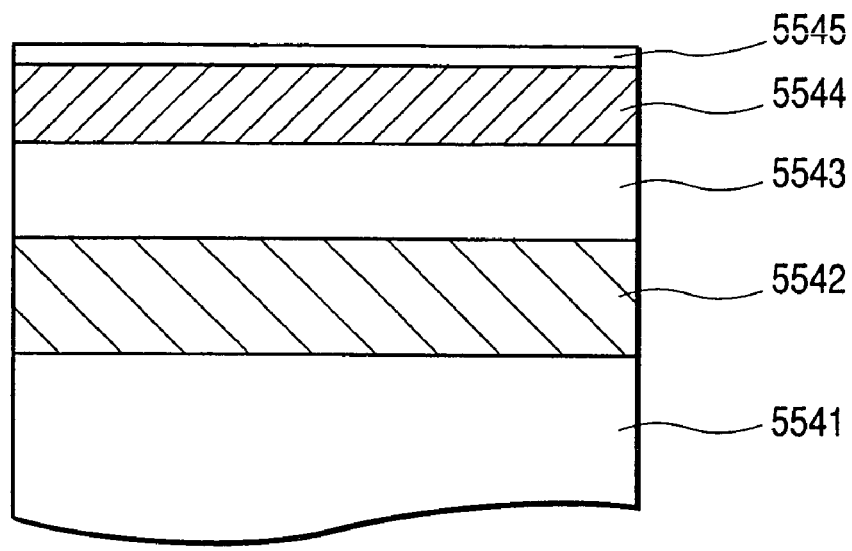
FIGS. 13A and 13B are schematic views illustrating a prior art.
Figure 13B:
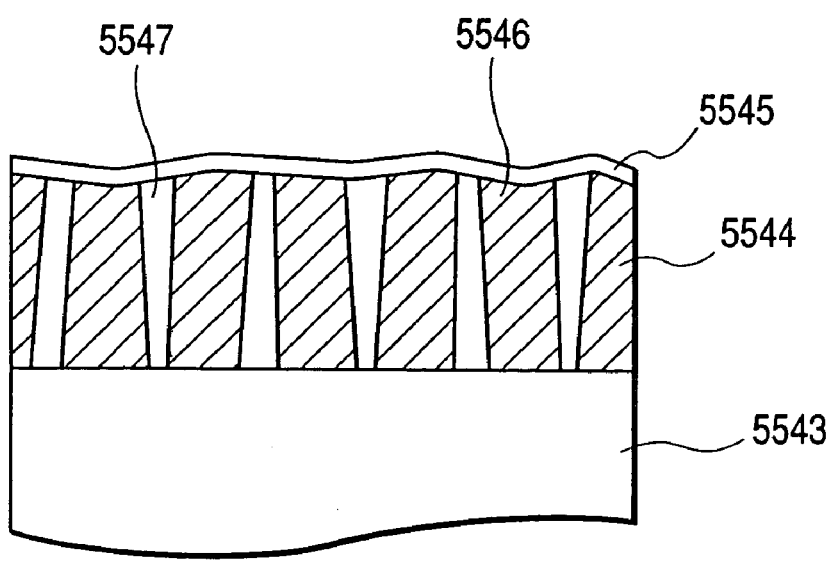

This will be explained in detail using the illustrations of a conventional perpendicular magnetic recording medium in FIGS. 13A and 13B below. As a substrate 5541, a carbon substrate, plastic substrate, Si substrate, etc., can be used in addition to glass or aluminum. In the case of an aluminum substrate, a NiP layer 5542 is often created as a base layer using a plating method, etc., to secure hardness as shown in FIG. 13A. As a backing layer 5543, high magnetic permeability NiFe alloy (Permalloy), etc., of several μm to several tens of μm in thickness is used. As a recording layer 5544, a Co—Cr alloy is generally used and when created using a sputtering method, it grows separated into a core section 5546 with a large Co content and a shell section 5547 with a relatively large Cr content surrounding the core section 5546 as shown in FIG. 13B. The core section 5546 has a column-like shape, acquires hard magnetism having a hexagonal close-packed structure (hereinafter referred to as "hcp structure") constituting a recording section. The shell section 5547 has a large Cr content, has a soft magnetic or non-magnetic characteristic and also plays the role of weakening interaction between neighboring cores. In the core section 5546, the c-axis is oriented toward the direction perpendicular to the plane of the substrate and the magnetization is oriented toward the perpendicular direction due to action of crystalline magnetic anisotropy. For the above-described recording layer 5544, Ta, Pt, Rh, Pd, Ti, Nb, Hf, etc., are added in addition to Co—Cr.

With regard to a further increase of recording density in the future, it is anticipated that it will be difficult to miniaturize the core section 5546 in the Co—Cr system. Moreover, the super paramagnetism will become noticeable with miniaturization, and therefore an $L1_0$-ordered alloy of CoPt, FePt and FePd which is attracting attention in recent years is believed to be a promising material in the future. Especially, there is also a proposal of a medium consisting of a film (granular film) obtained by transforming the aforementioned ordered alloy into micrograms and distributing the micrograms into a non-magnetic matrix, resistant to super paramagnetic effects involved in Co—Cr-based magnetic grains in further reduced sizes (Japanese Patent Application Laid-Open No. 2001-273622).

However, the orientation of an ordered alloy is not fully controlled and control over the orientation is required for a perpendicular magnetic recording medium.

Furthermore, though not shown in FIGS. 13A and 13B, a base layer is formed between the recording layer 5544 and backing layer 5543 for the purpose of enhancing the crystallinity of the recording layer or an oxide base layer, etc., is formed to weaken magnetic bond between the recording layer 5544 and backing layer 5543 (see Japanese Patent Application Laid-Open No. 7-73429).

Furthermore, a thin protective layer 5545 is generally formed on the surface of the recording medium and carbide, nitride, etc., are considered as its material in addition to carbon.

In the CoCr-based recording layer formed by the above-described conventional sputtering, the diameter of magnetic micrograms is as large as over ten nm and there is a large variation in the shape. Furthermore, for a granular film having an $L1_0$-ordered structure, it is difficult to control the orientation of magnetic grains and also difficult to keep their volume and size uniform. Variations in the size of MPt (M=Co, Fe, Ni) micro crystals or each microgram reflect in variations in a coercive force of micrograms, deteriorating the characteristic as the recording medium. Of course, variations in the orientation of the crystal axes of microcrystals also deteriorate the characteristic.

This Second embodiment has been implemented in view of these problems. More specifically, the invention related to the magnetic recording medium according to this Second embodiment is a magnetic recording medium having a base layer and recording layer on a substrate, wherein the recording layer includes columnar members comprised of a magnetic material and an area comprised of silicon oxide (or SiGe oxide) surrounding the columnar members, the base layer includes a square crystalline array in the in-plane direction of the substrate and the columnar members include a hard magnetic material portion having an $L1_0$-ordered structure which is c-axis-oriented in the direction perpendicular to the substrate.

The above-described area may be comprised of oxide or non-oxide as required. Instead of the entire porous body, the walls of the micropores may also be selectively comprised of oxide.

The configuration of the perpendicular magnetic recording medium according to this embodiment will be explained below. This embodiment is especially characterized by applying the structure 1001 shown in FIG. 1 to the recording layer portion.

The structure referred to here consists of the columnar members 1000 comprised of the first material surrounded by the area 1002 comprised of the second material, wherein the columnar members can be selectively removed from the structure. Especially, the second material is preferably included at a proportion of 20 atomic % or above and 70 atomic % or less of the total amount of the first material and second material. By the way, the following explanation will describe a case where aluminum is used as the first material and silicon is used as the second material (or a mixture of silicon and germanium), but any material can be selected and any mixing ratio of the respective materials can be set as appropriate if at least the columnar members can be removed selectively from the above-described structure.

<Configuration of Magnetic Recording Medium>

Figure 3:
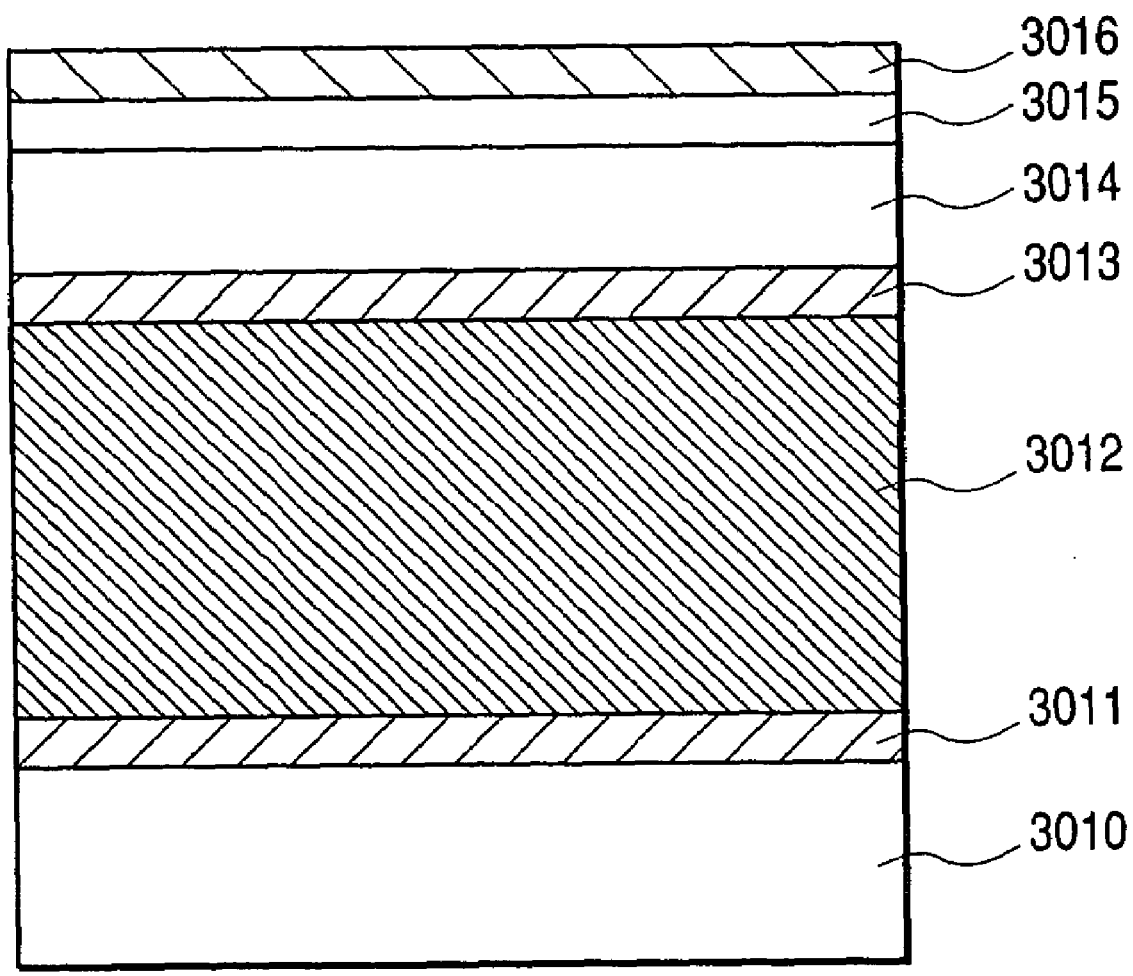
FIG. 3 schematically illustrates an example of a function device according to the present invention.
Figure 4A:
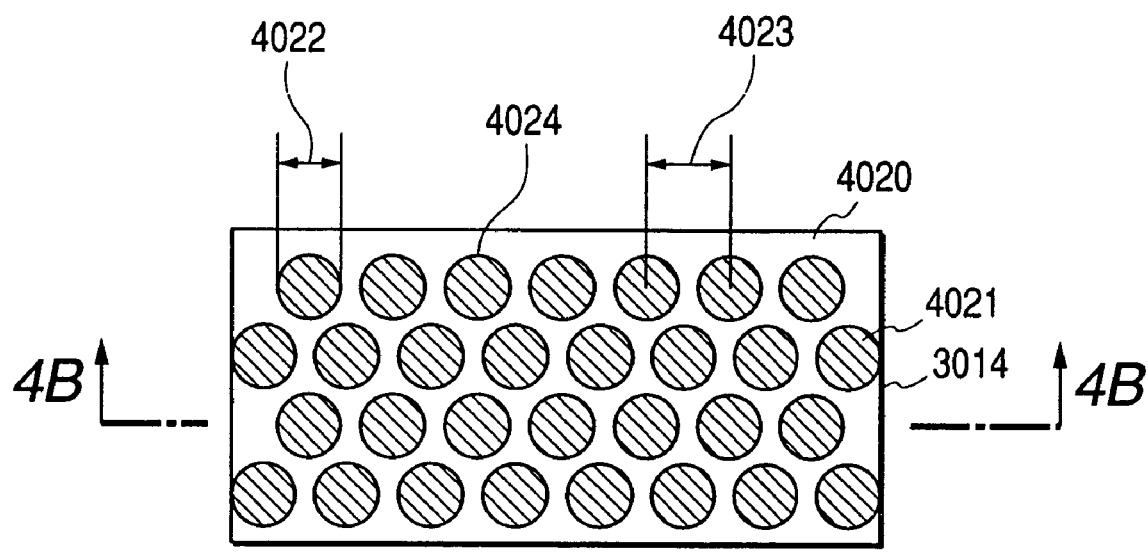
FIGS. 4A and 4B are schematic views of a structure applied to the present invention.
Figure 4B:
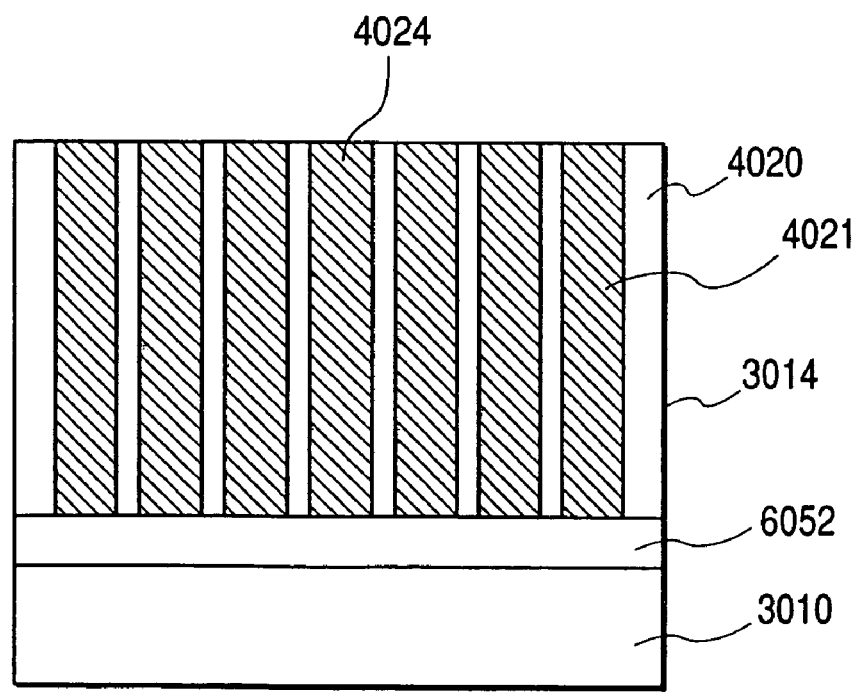

The perpendicular magnetic recording medium of the present invention will be explained based on drawings. FIG. 3 is a schematic view showing an example of an aspect of the magnetic recording medium of the present invention. Furthermore, FIGS. 4A and 4B are schematic views showing an example of an aspect of the recording layer of the perpendicular magnetic recording medium of the present invention. FIG. 4B is a cross-sectional view of FIG. 4A cut along a line 4B—4B.

In FIG. 3, reference numeral 3010 denotes a substrate; 3011, a base layer A; 3012, a soft magnetic material layer; 3013, a base layer B; 3014, a recording layer; 3015, a protective layer; and 3016, a lubrication layer. Furthermore, in FIGS. 4A and 4B, reference numeral 4020 denotes a non-magnetic material portion; 4021, a columnar structure section; 4022, a diameter of a columnar structure; 4023, a distance between the columnar structures; 4024, a micropore. A base layer 6052 in FIG. 4B collectively shows the three layers of the base layer A 3011, soft magnetic material layer 3012 and base layer B 3013 of FIG. 3.

According to the present invention, the base layer A 3011, soft magnetic material layer 3012, base layer B 3013, recording layer 3014, protective layer 3015, and lubrication layer 3016 are placed in that order on the substrate 3010.

Especially, the recording layer 3014 consists of a non-magnetic material portion 4020 and columnar structure portions (columnar members) 4021. When silicon is selected as the second material, the diameter 4022 of each columnar structure is in the range, for example 1 to 9 nm and the distance 4023 between the columnar structures is in the range, for example, 3 to 10 nm.

By the way, when a mixture of silicon and germanium is used as the second material, the diameter 4022 of each columnar structure is in the range, for example, 1 to 15 nm and the distance 4023 between the columnar structures is in the range, for example, 3 to 20 nm.

The recording layer 3014 according to the present invention is formed by forming a structure consisting of columnar aluminum portions comprised of aluminum standing on the base layer in the direction perpendicular to the substrate and a silicon portion (or SiGe portion) comprised of silicon (or SiGe) arranged in such a way as to surround the side of the columnar aluminum portions, removing the columnar aluminum portions of the structure to form micropores, oxidizing the silicon portion (or SiGe portion) comprised of silicon (or SiGe) into silicon oxide (or SiGe oxide) and then filling the inside of the micropores with a columnar structure containing a hard magnetic material portion to form a recording layer.

The aluminum-silicon structure used in the present invention will be explained using FIGS. 5A and 5B. FIG. 5B is a cross-sectional view of FIG. 5A cut along a line 5B—5B. By the way, a case where silicon is selected as the second material will be explained as an example, but SiGe can also be used instead of silicon.

An aluminum-silicon structure 5034 is characterized by having a structure with columnar aluminum portions 5031 standing upright in the direction perpendicular to the substrate and a silicon portion 5030 arranged in such a way as to surround the sides of the columns. By the way, the aluminum portion is mixed with a small amount of silicon, and the silicon portion is mixed with a small amount of aluminum. Furthermore, in forming this structure, it is preferable to form the aluminum and silicon films simultaneously in a non-equilibrium state. Furthermore, this embodiment is characterized in that the columnar aluminum portions 5031 stand upright in the direction perpendicular to the substrate, and it is possible to selectively dissolve and remove mainly columnar aluminum portions 5031 by immersing the columnar aluminum portions 5031 in acid or alkali, for example, phosphoric acid that does not dissolve silicon and dissolves only the columnar aluminum portions 5031.

Furthermore, it is also possible to remove the columnar aluminum portions 5031 by subjecting this aluminum-silicon structure to anodization in an aqueous solution of sulfuric acid, etc. At this time, the silicon portion 5030 is oxidized into $(Al_xSi_{1-x})_yO_{1-y}$ during anodization. X preferably falls within a range of X=0.01 to 0.2. Furthermore, anodization preferably ends in 30 to 60 sec after micropores reach the base layer. Or anodization may also be performed until the current value of anodization reaches a minimum value.

By the way, when SiGe is used as the second material, the SiGe portion 5030 is oxidized into $(Al_p(Si_qGe_{1-q})_{1-p})_rO_{1-r}$ during anodization. Here, p preferably falls within a range of $0<p\leq0.2$ and q preferably falls within a range of $0<q<1$. Furthermore, p may be preferably in the range $0<p\leq0.1$. Furthermore, q may also range $0\leq q\leq1$. Furthermore, the oxidation preferably takes place within a range of $0.334\leq r\leq0.9$ and more preferably $0.334\leq r\leq0.5$.

Though it depends on the composition, for this aluminum-silicon structure, it is preferable that the diameter 5032 of the columnar aluminum is in the range 1 nm to 9 nm and distance 5033 between the columnar aluminum portions is in the range 3 nm to 10 nm. By the way, in the case of the Al—SiGe structure, though it also depends on the composition, this embodiment is characterized in that the diameter 5032 of columnar Al is in the range 1 nm to 15 nm and the distance 5033 is in the range 3 nm to 20 nm.

According to this embodiment, using a hard magnetic material predominantly comprised of MPt (M=Co, Fe, Ni) having an $L1_0$-ordered structure for the columnar structure portions 4021 in FIGS. 4A and 4B allows high density recording and sufficient signal detection more preferably. The diameter 4022 of the columnar structure is preferably in the range 1 to 9 nm (1 to 15 nm when SiGe is used as the second material) and the distance 4023 between the columnar structures is preferably in the range 3 to 10 nm (3 to 20 nm when SiGe is used as the second material) and the aspect ratio of the column is preferably approximately 2 to 10. Most preferably, the diameter 4022 of the columnar structure is 3 to 7 nm (5 to 10 nm when SiGe is used as the second material) and the distance 4023 between the columnar structures is in the range 4 to 8 nm (7 to 12 nm when SiGe is used as the second material).

The cross-sectional shape of the micropores (nano-holes) 4024 is preferably circular and each cross-section is preferably uniform. Furthermore, the columnar structure preferably stands linearly and upright with respect to the base layer.

Furthermore, the non-magnetic material portion 4020 consists of $(Al_xSi_{1-x})_yO_{1-y}$, where x is preferably in the range x=0.01 to 0.2. By the way, when SiGe is used as the second material, the non-magnetic material portion consists of $(Al_x(Si_yGe_{1-y})_{1-x})_zO_{1-z}$, where x is preferably in the range $0<x\leq 0.2$ and y is preferably in the range $0<y<1$. More preferably, y is in the range $0<y\leq 0.1$. Also, y may be $0\leq x\leq 1$. Furthermore, the oxidation state is in the range $0.334\leq z\leq 0.9$ and preferably, $0.334\leq z\leq 0.5$.

Furthermore, to embed a filler in micropores, a vapor deposition method, CVD method or sputtering method, etc., are also available. To embed a filler in micropores with a greater aspect ratio, an electrodeposition method is preferable. To create a multilayer film using the electrodeposition method, it is possible to use a method of carrying out electrodeposition using pulses in a solution containing ions with different electrolyte potentials in addition to the method of changing an electrodeposition solution during electrodeposition. That is, it is possible to add a small proportion of ions with a small electrolyte potential such as Pt, Cu and Ni to the electrodeposition solution containing Co ions having a large electrolyte potential, allow only ions with a smaller electrolyte potential to deposit at a low voltage, then allow high concentration Co to deposit at a high voltage. When forming MPt (M=Co, Fe, Ni) having an $L1_0$-ordered structure, it is also possible to form a multilayer film using pulse electrodeposition and then apply heat treatment.

Furthermore, various metals can be used as the base layer B 3013 placed below the recording layer 3014, but from the standpoint of electrodeposition control, it is preferable to use Pt, Pd, Cu, Ir, Rh and other precious metals and an alloy of those metals, which constitute an fcc structure and are (001)-oriented in the direction perpendicular to the substrate. Furthermore, one or more types of W, Nb, Ti, Si, O, etc., can also be included in addition to main components if they fall within the range of this orientation. Furthermore, it is also possible to include any one of $L1_0$-, $L1_1$- and $L1_2$-ordered structures and use a film placed in a square crystalline array in the in-plane direction of the substrate as the base layer B 3013. More specifically, it is also possible to select from the $L1_0$-ordered structure predominantly comprised of MPt (M=Co, Fe, Ni), FePd, TiAl and CuAu, or $L1_1$-ordered structure predominantly comprised of CuPt or $L1_2$-ordered structure predominantly comprised of $Cu_3Au$, $Al_3Ti$, $FePd_3$, $Ni_3X$ (X=Fe, Mn, Al), $Pt_3X$ (X=Co, Fe, Mn, Ag, Al) and $PtX_3$ (X=Ag, Au, Fe, Mn, Ni), etc. Furthermore, it is preferable to insert (001)-oriented MgO for orientation control of these base layers B 3013.

The film (layer) placed in a square crystalline array in the in-plane direction of the substrate here refers to a (001)-oriented film (layer) in the direction perpendicular to the substrate in the case of the fcc structure, a film (layer) whose direction perpendicular to the substrate is composed of a {001} plane, that is, a film (layer) whose c-axis stands upright in the case of the $L1_0$- and $L1_2$-ordered structures, and a film (layer) whose direction perpendicular to the substrate consists of a {001} plane in the case of the $L1_1$-ordered structure.

Figure 10A:
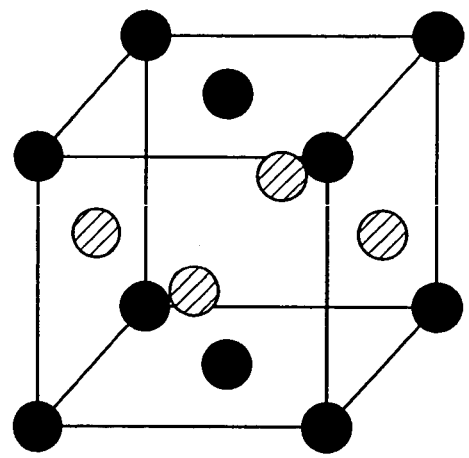
FIGS. 10A, 10B and 10C are schematic views showing their respective ordered structures.
Figure 10B:
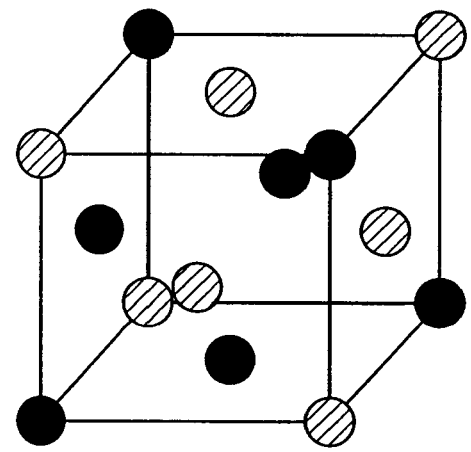
Figure 10C:
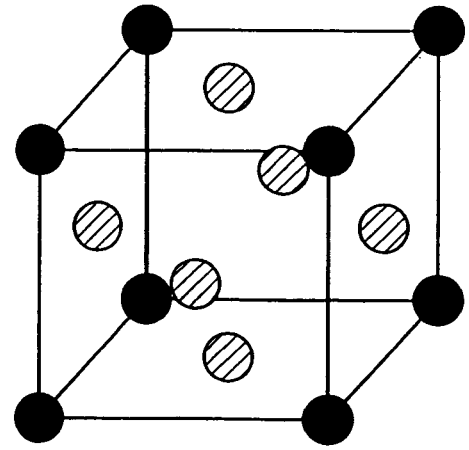

By the way, the $L1_0$-ordered structure in the present invention refers to the structure shown in FIG. 10A. The $L1_1$-ordered structure refers to the structure shown in FIG. 10B. The $L1_2$-ordered structure refers to the structure shown in FIG. 10C.

Furthermore, "fcc" in the present Specification is an abbreviation of "face centered cubic."

Figure 6A:
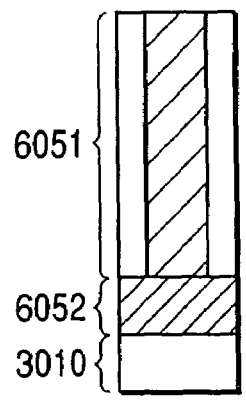
FIGS. 6A, 6B, 6C, 6D and 6E illustrate examples of a filler to fill the inside of pores according to the present invention.
Figure 6B:
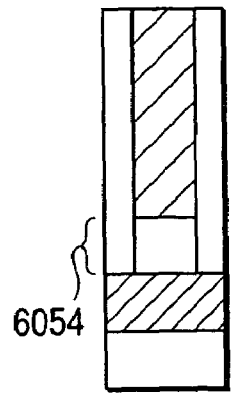
Figure 6C:
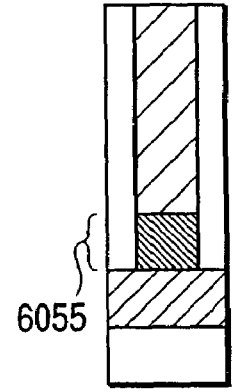
Figure 6D:
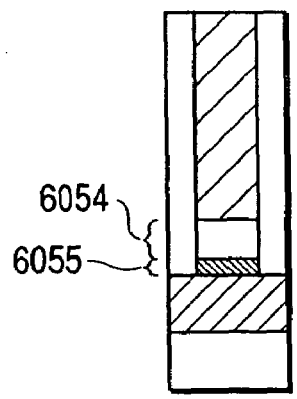

Furthermore, the columnar structure portions 4021 in the above-described recording layer 3014 can be constructed, from the top to the contact with the base layer B 3013 as shown, for example, in FIGS. 6A to 6E and FIGS. 7F and 7G, in forms like a hard magnetic material ($L1_0$-ordered structure) 6051 (FIG. 6A) or hard magnetic material ($L1_0$-ordered structure) 6051/non-magnetic material 6054 (FIG. 6B) or hard magnetic material ($L1_0$-ordered structure) 6051/soft magnetic material 6055 (FIG. 6C) or hard magnetic material ($L1_0$-ordered structure) 6051/soft magnetic material 6055/non-magnetic material 6054 (FIG. 6E) or hard magnetic material ($L1_0$-ordered structure) 6051/non-magnetic material 6054/soft magnetic material 6055 (FIG. 6D).

Here, the hard magnetic material ($L1_0$-ordered structure) is c-axis-oriented toward the direction perpendicular to the substrate and the non-magnetic material and soft magnetic material are characterized by having an fcc structure (001)-oriented toward the direction perpendicular to the substrate. Furthermore, the hard magnetic material ($L1_0$-ordered structure) portion is predominantly comprised of MPt (M=Co, Fe, Ni) and may also include one or more types of Ag, Pd, Ir, Rh, Cu, Cr, P and B. Furthermore, the non-magnetic material portion has an fcc structure and is predominantly comprised of either precious metal or Cu and is preferably (001)-oriented toward the direct-ion perpendicular to the substrate. Furthermore, it also includes one or more types of W, Nb, Ti, Si, O, etc., in addition to precious metal and Cu as main components.

Furthermore, the soft magnetic material portion is predominantly comprised of $Ni_ZFe_{1-Z}$ and Z is preferably in the range 0.65 to 0.91 and may also partially contain Ag, Pd, Ir, Rh, Cu, Cr, P, B, etc. The non-magnetic material portion is preferably one of Al, Si or Ge or a plurality of oxides, nitrides or silicon, carbon, etc.

Furthermore, in addition to the above-described hard magnetic material ($L1_0$-ordered structure), non-magnetic material and soft magnetic material, there can also be an $L1_2$-ordered structure portion. For example, the columnar structure can be constructed, from top down, of $L1_2$-ordered structure ($Fe_3Pt$)/$L1_0$-ordered structure (FePt) (FIG. 7F) or $L1_0$-ordered structure (FePt)/$L1_2$-ordered structure ($FePt_3$) (FIG. 7G). At this time, the boundary between the structures may be distinctively separated or may change gradually. Especially, each boundary is likely to appear as a result of influences of mutual diffusion due to annealing, and in this case, the boundary between regular phases is considered to become ambiguous.

Furthermore, it is preferable to use epitaxial-grown structures for the above-described columnar structure portions, and this means that the columnar structure portions grow while keeping their crystalline orientations influenced by the planes arranged in a square crystalline array in the in-plane direction of the substrate of the fcc structure of the base layer B 3013, or $L1_0$-ordered structure, $L1_1$-ordered structure or $L1_2$-ordered structure. This does not deny cases of non-single crystal or cases of lattice mismatch with the base layer B 3013, etc. Furthermore, it is also possible to highly orient the c-axis of the $L1_0$-ordered structure in the direction perpendicular to the substrate through heat treatment. At this time, mutual diffusion may partially occur in the base layer B 3013 and columnar structure portions 4021.

As the above-described substrate 3010, it is preferable to use glass, aluminum, carbon, plastics, Si, etc., as the substrate. Furthermore, in the case of an aluminum substrate, it is desirable to form a NiP film as the base layer using a plating method, etc., to secure hardness.

Furthermore, it is effective to form the soft magnetic material layer 3012 between the substrate 3010 and base layer B 3013 as a backing layer. In that case, if necessary to form the soft magnetic material layer 3012, it is preferable to insert the base layer A 3011. Furthermore, as the backing layer, a film predominantly comprised of $Ni_ZFe_{1-Z}$ can be used with Z preferably ranging from 0.65 to 0.91. Furthermore, it can also partially contain Ag, Pd, Ir, Rh, Cu, Cr, P, B, etc. Furthermore, at this time, the sequence from bottom up may be an MgO layer, base layer A 3011, soft magnetic material layer 3012 and base layer B 3013 or soft magnetic material layer 3012, MgO layer and base layer B 3013. In the case of $Ni_ZFe_{1-Z}$, the soft magnetic material layer may be preferably (001)-oriented, but since other soft magnetic materials are also available, other states such as an amorphous state may also be adopted.

Furthermore, the top surface of the magnetic recording medium is subjected to precision polishing using diamond slurry, etc., and its Rms (root mean square) is 1 nm or less. It is further preferable to form a protective layer 3015 on the surface and effective to use a high hardness non-magnetic material such as carbon carbide and nitride to give it wear resistance against friction with the head.

Furthermore, it is preferable to apply PFPE (perfluoropolyether) to the lubrication layer.

By the way, the porous body can be formed not only by anodization of the above-described structure but also by etching. Furthermore, the porous material may or may not be oxide as required. For example, it is possible to adopt a configuration with the porous body comprised of amorphous silicon or with the walls of micropores selectively comprised of oxide.

<Method for Manufacturing Perpendicular Magnetic Recording Medium>

Hereunder, the method for manufacturing a perpendicular magnetic recording medium according to this embodiment will be explained in detail.

By the way, a case of the structure (1001 of FIG. 1) including columnar members and the area surrounding them, wherein silicon is selected as the second material composing the area will be explained. However, this configuration will is likewise applicable to a case where another material, for example, SiGe is selected.

Figure 11:
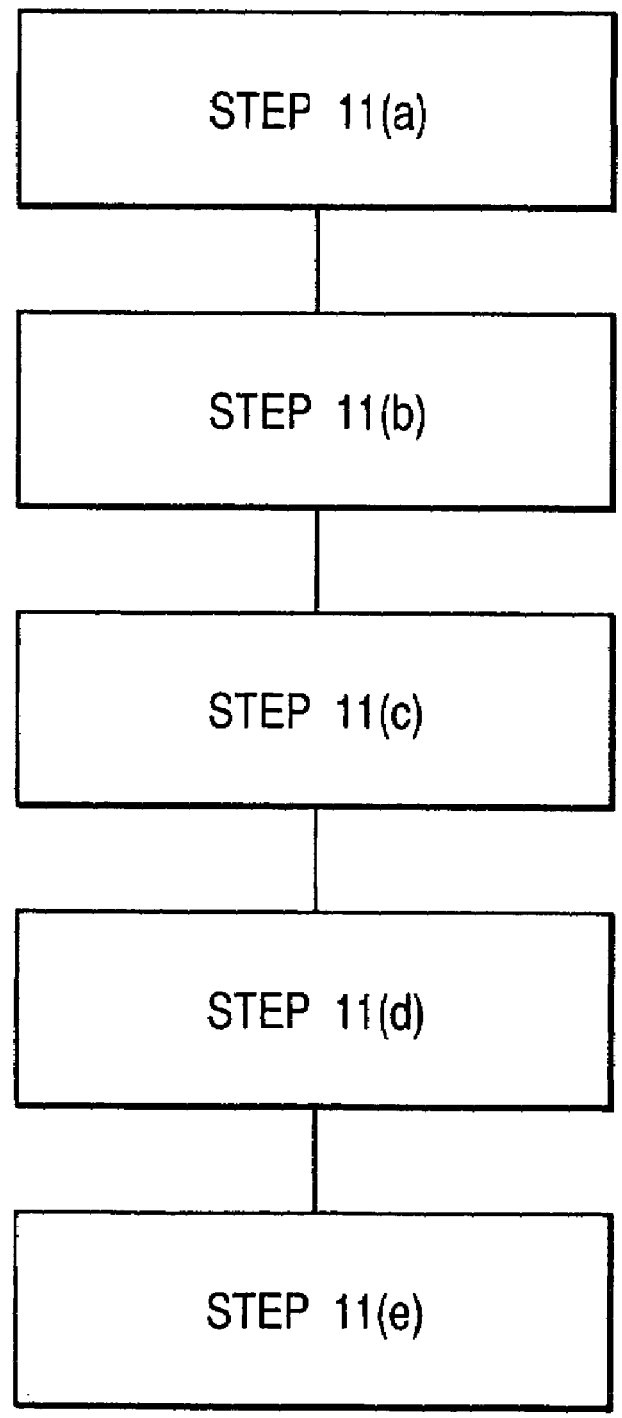
FIG. 11 is a process chart showing an aspect of a method for manufacturing a magnetic recording medium according to the present invention.

FIG. 11 is a process chart showing an embodiment of a method for manufacturing a perpendicular magnetic recording medium of the present invention. In FIG. 11, the method for manufacturing a perpendicular magnetic recording medium according to this embodiment relates to a method for manufacturing a perpendicular magnetic recording medium comprising micropores filled with columnar structures standing in the direction perpendicular to a substrate and a recording layer comprised of silicon oxide including the micropores on the substrate, and is characterized by including the following steps 11(*a*) to 11(*e*):

Step 11(*a*): A base layer is formed on a substrate. A base layer having a square crystalline array is formed in parallel to the surface of the substrate.

Step 11(*b*): Next, an aluminum-silicon structure comprising columnar aluminum portions comprised of aluminum and a silicon portion comprised of silicon arranged in such a way as to surround the columnar aluminum portions is formed on the substrate through the process of simultaneous stacking of aluminum and silicon in a non-equilibrium state.

Step 11(*c*): The columnar aluminum portions of the aluminum-silicon structure are removed to form micropores and the silicon portion comprised of silicon is oxidized.

Step 11(*d*): A portion predominantly comprised of MPt (M=Co, Fe, Ni) is formed in the micropores through electrodeposition, which is subjected to annealing and filled with columnar structures including hard magnetic material portions having an $L1_0$-ordered structure which is c-axis-oriented in the direction perpendicular to the substrate to form a recording layer.

Step 11(*e*): A protective layer and lubrication layer are formed in that order on the recording layer.

Next, the above-described steps will be explained in sequence.

Step 11(*a*): Base Layer Formation Step

A base layer having a square crystalline array on the substrate is formed in parallel to the surface of the substrate.

The method for forming the base layer can be carried out using a sputtering method, vapor deposition method, molecular beam epitaxy growth method, etc. The base layer may consist of 1 layer or 2 layers. Furthermore, as shown in FIG. 3, two layers of a base layer A 3011 and a base layer B 3013 may also be provided on the substrate through a soft magnetic material layer 3012.

Step 11(*b*): Aluminum-Silicon Structure Formation Step

Next, an aluminum-silicon structure comprising columnar aluminum portions comprised of aluminum and a silicon portion comprised of silicon arranged in such a way as to surround the columnar aluminum portions is formed on the substrate through the process of simultaneous stacking of aluminum and silicon in a non-equilibrium state.

The present invention is especially characterized by a step of forming an aluminum-silicon structure, and so this step will be explained below.

An aluminum-silicon structure is formed on the base layer of the substrate using a film formation method of forming substances with aluminum and silicon in a non-equilibrium state. Here, an example of using a sputtering method will be shown as a film formation method for forming substances in a non-equilibrium state.

Figure 12:
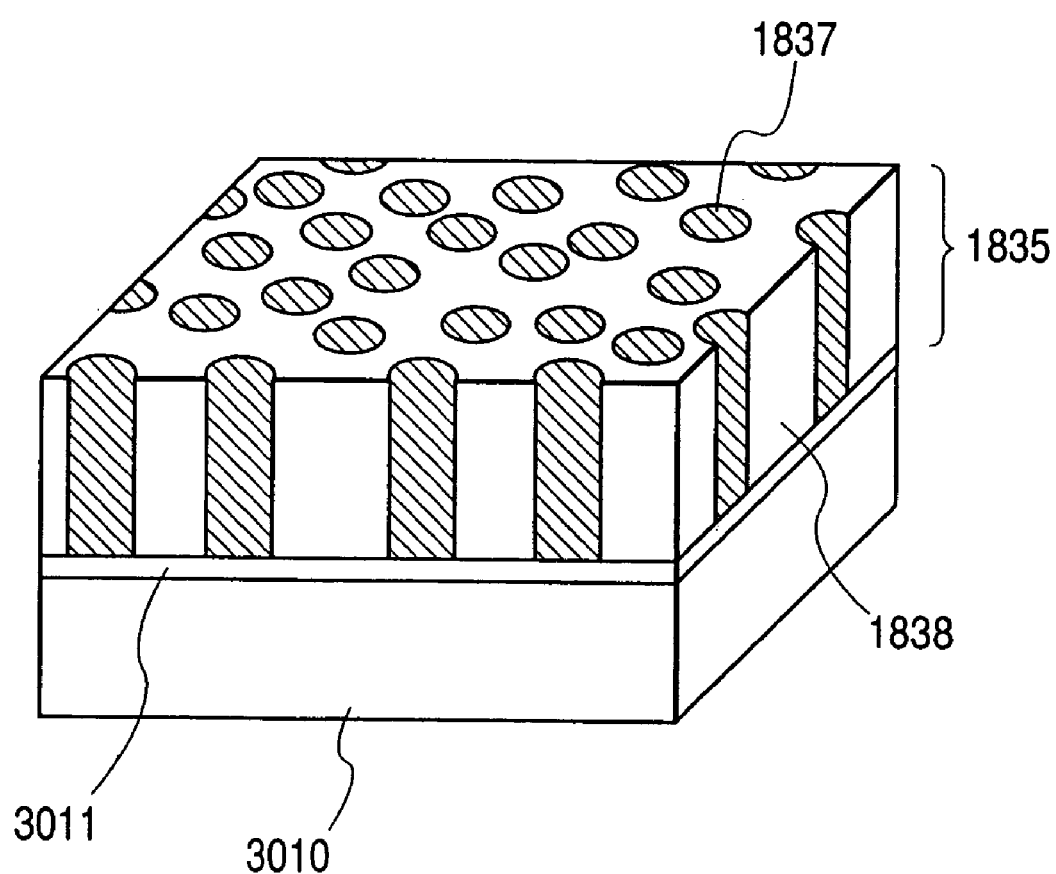
FIG. 12 is a schematic view illustrating the present invention.

As shown in FIG. 12, on the substrate 3010 on which the base layer 3011 is formed, an aluminum-silicon structure 1835 is formed using a magnetron sputtering method, which is a film formation method for forming substances in a non-equilibrium state. The aluminum-silicon structure 1835 is constructed of columnar aluminum portions 1837 comprised of aluminum and a silicon portion 1838 comprised of silicon surrounding the columnar aluminum portions 1837.

Using FIG. 2 again, the method of forming an aluminum-silicon structure using the sputtering method as the film formation method in a non-equilibrium state will be explained. By the way, in FIG. 2, reference numeral 1003 denotes the substrate and 2003 denotes the sputtering target. Use of the sputtering method allows the proportions of aluminum and silicon to be changed easily.

As shown in FIG. 2, an aluminum-silicon structure is formed on the substrate 1003 using the magnetron sputtering method, which is a film formation method of forming substances in a non-equilibrium state.

As raw materials, silicon and aluminum are provided by placing the silicon chips 2002 on the aluminum target 2003 as shown in FIG. 2 (when SiGe is used as the second material, for example, appropriate amounts of Si and Ge pieces are placed). In FIG. 2, a plurality of silicon chips are placed, but of course, the invention is not limited to this. Even a single silicon chip is acceptable if it at least allows desired film formation. However, it is preferable to place silicon chips symmetrically with respect to the substrate 1003 to uniformly distribute columnar structures including uniform aluminum within the silicon area.

Furthermore, it is also possible to use a calcinated product resulting from calcination of predetermined amounts of aluminum and silicon powders as the target material for film formation.

Furthermore, it is also possible use a method of preparing an aluminum target and a silicon target separately and sputtering both targets simultaneously.

The amount of silicon formed in the film is 20 to 70 atomic % with respect to the total amount of aluminum and silicon, preferably 25 to 65 atomic %, and more preferably 30 to 60 atomic %. If the amount of silicon is within such a range, it is possible to obtain an aluminum-silicon structure in which aluminum columnar structures are distributed in the silicon area. (When SiGe is selected as a second material, the amount of SiGe formed in the film with respect to the total amount of Al and SiGe is 20 to 70 atomic %, preferably 25 to 65 atomic %, and more preferably 30 to 60 atomic %. If the amount of SiGe is within such a range, it is possible to obtain an Al—SiGe structure in which Al columnar structures are distributed in the SiGe area. Furthermore, the ratio of composition of SiGe is arbitrary and the differences in the composition is reflected as differences in the diameters of or distance between the columnar structures Al.)

The atomic % indicating the above-described proportions of aluminum and the silicon indicates the proportions of the number of atoms of silicon and aluminum and is also described as atom % or at %, and represents a value when the amounts of silicon and aluminum in the aluminum-silicon structure are quantitatively analyzed using, for example, an inductively coupled plasma emission spectrometry.

Furthermore, the substrate temperature is set, for example, to 200° C. or less.

If an aluminum-silicon structure is formed using such a method, aluminum and silicon become eutectic organizations in a quasi-stable state and aluminum forms a columnar structure at a level of several nm and is separated in a self-organizing manner. Aluminum at that moment is almost cylindrical and its diameter is, for example, 1 to 9 nm and their distance is, for example, 3 to 10 nm. (When SiGe is selected as the second material, its diameter is 1 to 15 nm and its distance is 3 to 20 nm.)

The amount of silicon of the aluminum-silicon structure can be controlled by changing, for example, the number of silicon chips placed on an aluminum target.

When film formation is performed in a non-equilibrium state, and when the sputtering method is used in particular, the pressure in the reactor when an argon gas is put can be approximately 0.2 to 1 Pa. However, the present invention is not particularly limited to this and any pressure is acceptable if it allows argon plasma to be formed stably.

With regard to the film formation method for forming substances in a non-equilibrium state, a sputtering method is preferred, but any film formation method for forming substances in a non-equilibrium state such as resistance heating vapor deposition and electron beam vapor deposition (EB vapor deposition) is applicable.

Furthermore, as a film formation method, it is also possible to use a simultaneous film formation process for forming silicon and aluminum simultaneously or a multilayer formation process of stacking silicon and aluminum by several atomic layers at a time.

The aluminum-silicon structure 1001 formed in the above-described way is provided with the columnar aluminum portions 1000 predominantly comprised of aluminum and the silicon portion 1002 predominantly comprised of silicon surrounding the columnar aluminum portions 1000.

The columnar aluminum portions 1837 containing aluminum are predominantly comprised of aluminum, but they can also contain other elements such as silicon, oxygen and argon if at least columnar microstructures can be obtained. Here, as the predominant component, the proportion of aluminum in the composition ratio of the columnar structure portions is 80 atomic % or above or preferably 90 atomic % or above.

Furthermore, the composition of the silicon portion 1838 surrounding the columnar aluminum portions is comprised of silicon, but various elements such as aluminum, oxygen and argon can also be contained if at least columnar microstructures can be obtained. By the way, as the main component, the proportion of silicon at the composition ratio of the silicon portion is 80 atomic % or above or preferably 80 to 98 atomic %, and more preferably 93 to 98 atomic %. (When SiGe is selected as the second material, the composition of the SiGe portion surrounding the columnar Al portion is comprised of SiGe, but various elements such as Al, O and Ar can also be contained if at least the columnar microstructure can be obtained. By the way, as the main component, the proportion of SiGe in the composition ratio of the SiGe portion is 80 atomic % or above or preferably 85 to 99 atomic %.)

As described above, by sputtering aluminum and silicon, on the substrate simultaneously, an anluminum-silicon structure consisting of an infinite number of columnar aluminum portions standing in the direction perpendicular to the substrate and a silicon portion placed in such a way as to surround the sides of the columnar aluminum portions is formed. The diameter of columnar aluminum in this case is preferably 1 to 9 nm and the distance between columnar aluminum portions is preferably 3 to 10 nm. These diameter and distance are determined by the composition ratio of aluminum to silicon.

The silicon portion 1838 surrounding the columnar aluminum portions 1837 of the above-described structure becomes a non-magnetic material portion 4020 surrounding columnar structure portions 4021 comprised of a hard magnetic material. The silicon portion 1838 preferably has a composition of $Al_xSi_{1-x}$. X is 0.01 to 0.2, or preferably 0.02 to 0.07. (When SiGe is selected as the second material, the diameter of columnar portions Al is 1 to 15 nm and the distance between those columnar portions Al is 3 to 20 nm. These diameter and distance are determined by the composition ratio among Al, Si and Ge.

The SiGe portion 1838 surrounding the columnar Al portions 1837 of the above-described structure is oxidized and then becomes a non-magnetic material portion 4020 comprised of a non-magnetic material surrounding columnar structure portions 4021 comprised of a hard magnetic material. The SiGe portion 1838 before oxidation preferably has a composition of $Al_x(Si_yGe_{1-y})_{1-x}$, where x is in the range $0<x\leq0.2$ or preferably $0<x\leq0.1$. y is in the range $0<y<1$ but can also be set to $0\leq y\leq1$.)

Step 11(c): Step of Forming Micropores in the Structure and Oxidizing the Silicon Portion Next, the columnar aluminum portions of the aluminum-silicon structure are removed to form micropores and the silicon portion comprised of silicon is oxidized.

This step can be performed using the following two methods:

One is a method of etching only the columnar aluminum portions comprised of aluminum through anodization in an acid solution and forming micropores. The columnar aluminum portions are eluted through anodization in a solution of sulfuric acid, etc., to form micropores. In this case, the silicon portion is oxidized by anodization to become $(Al_xSi_{1-x})O_{Y1-Y}$ (X=0.01 to 0.2). (When SiGe is selected as the second material, the SiGe portion is oxidized through anodization to become $(Al_x(Si_yGe_{1-y})_{1-x})_zO_{1-z}$, where $0<x\leq0.2$, $0<y<1$. Furthermore, preferably $0<x\leq0.1$ and the range of y can also be set to $0\leq y\leq1$.)

The other is a method of immersing the aluminum columnar portions comprised of aluminum in an acid solution, selectively etching the aluminum columnar portions to form micropores. It is possible to remove aluminum by immersing the aluminum columnar portions in a solution such as phosphoric acid capable of dissolving only aluminum without dissolving silicon to form micropores. In this case, the silicon portion is oxidized after performing annealing in an oxidation atmosphere in another step to thereby form silicon oxide.

Step 11(*d*): Step of Filling the Micropores with the Columnar Structures Containing a Hard Magnetic Portion and Forming a Recording Layer Next, a portion predominantly comprised of MPt (M=Co, Fe, Ni) is formed in the micropores through electrodeposition, then annealing is performed and columnar structures containing a hard magnetic material portion having an $L1_0$-ordered structure which is c-axis-oriented in the direction perpendicular to the substrate are filled to form a recording layer.

Annealing is performed to create an ordered alloy. Annealing is preferably performed according to RTA (Rapid Thermal Annealing) to suppress mutual diffusion.

In this step, it is also possible to perform a step of electrodeposition on a portion having a structure made up of any one of an fcc structure, $L1_0$- or $L1_2$-ordered structure having a square crystalline array in parallel to the surface of the substrate, before or after the step of electrodeposition on a portion predominantly comprised of MPt (M=Co, Fe, Ni) of the columnar structures in micropores.

Furthermore, when filled according to the electrodeposition method, the magnetic material overflowed over the micropores is preferably subjected to precision polishing using diamond slurry, colloidal silica, etc., to make its Rms (root mean square) 1 nm or less.

The aforementioned recording layer can be formed by following the above-described steps.

Step 11(*e*): Step of Sequentially Forming Protective Layer and Lubrication Layer on the Recording Layer A protective layer is preferably formed using a plasma CVD method. Furthermore, it is preferable to form a lubrication layer by spin coating or dip coating.

Figure 8:
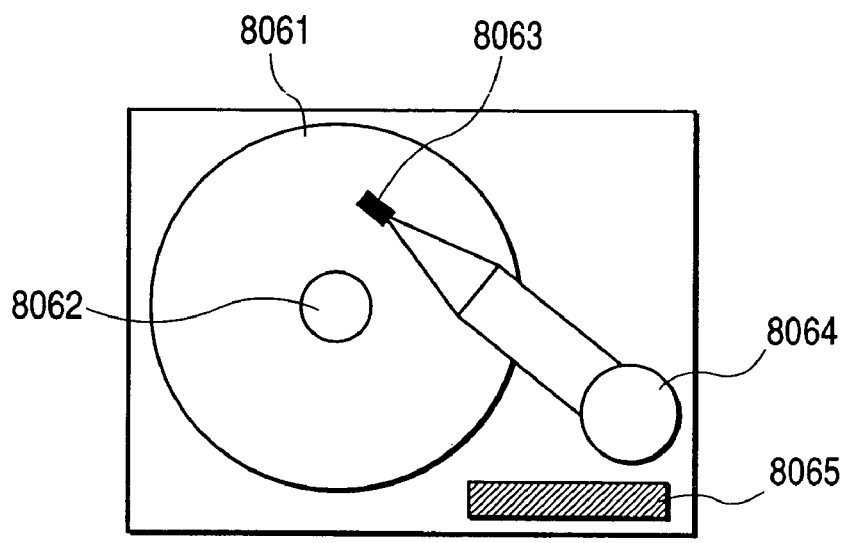
FIG. 8 is a schematic view showing a magnetic recording/reproduction apparatus using a magnetic recording medium of the present invention.

The magnetic recording medium of the present invention is effective as a perpendicular magnetic recording medium and using it as a magnetic recording/reproduction apparatus requires that a read/write magnetic head 8063, a drive control apparatus such as a motor, a signal processing circuit and a dust-proof case should be incorporated in addition to the above-described magnetic recording medium 8061 as shown in FIG. 8. However, with the magnetic recording/reproduction apparatus, driving of the magnetic recording medium or driving of the magnetic head is not limited to only rotation or only sliding on a circumference, respectively. Reference numeral 8062 denotes a magnetic recording medium drive section, 8065 denotes a signal processing section and 8064 denotes a magnetic head drive section.

Figure 9:
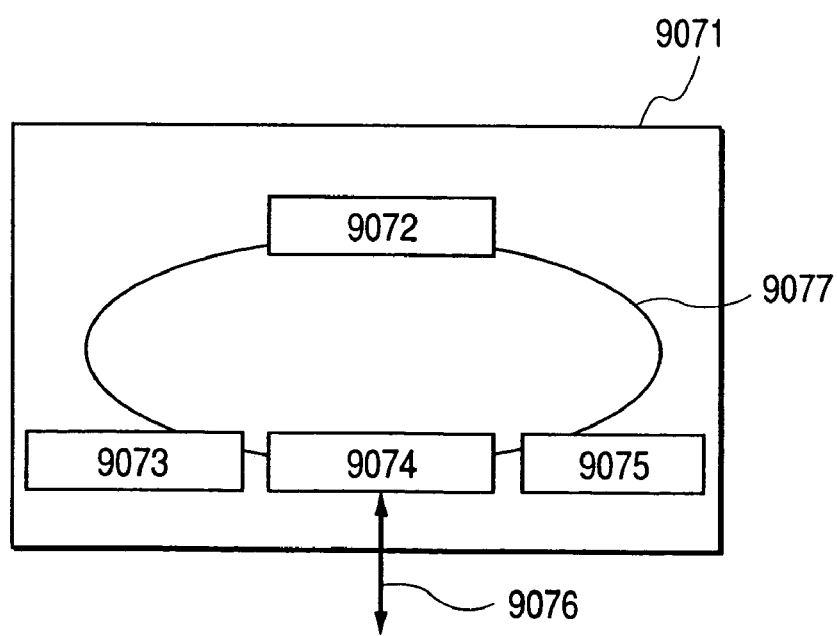
FIG. 9 is a conceptual diagram of an information processing apparatus using the magnetic recording/reproduction apparatus of the present invention.

Furthermore, when the above-described magnetic recording/reproduction apparatus is used as an information processing apparatus, it is necessary to form an information processing apparatus that houses not only a magnetic recording/reproduction apparatus 9072 but also a memory section 9074, a calculation section 9073, a power supply 9075, an external input/output section 9076 and wires 9077 for connecting them in a housing 9071 as shown in FIG. 9. The information processing apparatus may be either wired or wireless.

Third Embodiment

Applying AlSi to Soft Magnetic Material Layer

This embodiment will describe, as a function device, a magnetic recording device (more specifically, magnetic recording medium), a magnetic recording/reproduction apparatus, and further an information processing apparatus using the magnetic recording/reproduction apparatus. Especially, an embodiment related to a soft magnetic material layer of a double-layer perpendicular magnetic recording medium suited to high density recording will be explained.

With drastic expansion of information processing in recent years, there is a demand for drastic increases in capacities of information recording technologies such as magnetic disk apparatus. With regard to hard disks in particular, the amount of recording information per unit area is increasing on a pace beyond an annual rate of 60%. The increase in the amount of recording information is further expected in the future, and miniaturization and higher density are expected for portable recording apparatuses, etc.

A conventional magnetic recording medium for hard disks adopts a longitudinal magnetic recording system and magnetization is recorded in parallel to the surface of the disk. According to this longitudinal magnetic recording system, as densities are increased, it is necessary to reduce the thickness of the magnetic recording layer to suppress the diamagnetic domain in the magnetic domain and extend the magnetic field above the medium to detect the magnetization state. This reduces a volume per one magnetic grain significantly, resulting in a tendency to increase the likelihood of a superparamagnetism effect. That is, the energy that stabilizes the magnetization direction becomes smaller than thermal energy and the recorded magnetization varies with time, causing the record to disappear. For this reason, studies on replacing the longitudinal magnetic recording system by a perpendicular magnetic recording system which allows a greater film thickness of the recording layer are being actively conducted in recent years.

The perpendicular magnetic recording system has an advantage of reducing restrictions on the film thickness in the direction perpendicular to the substrate and considerably suppressing the decrease in volume involved in a reduction of the recording area. There are currently two proposals; a type of media using a single magnetic recording layer and a double-layer type of media using a soft magnetic material layer with high magnetic permeability as a backing layer with a hard magnetic recording layer placed thereon. The latter adopts a configuration of a magnetic circuit that concentrates the magnetic field from the perpendicular magnetic head on the recording layer, leads the magnetic field through the soft magnetic material layer horizontally and returns it to the head side. The double-layer type using this backing layer (Japanese Patent Application Laid-Open No. 52-78403) is known to demonstrate the effect of improving the recording/reproduction characteristic.

However, spike noise called "Barkhausen noise" is observed during recording/reproduction of the double-layer perpendicular magnetic recording medium using the soft magnetic material layer which is the backing layer. This is believed to be related to a problem with a change of state of magnetic domain walls which exist in the soft magnetic material layer and stabilizing these magnetic domain walls is essential to the elimination of noise.

Figure 14A:
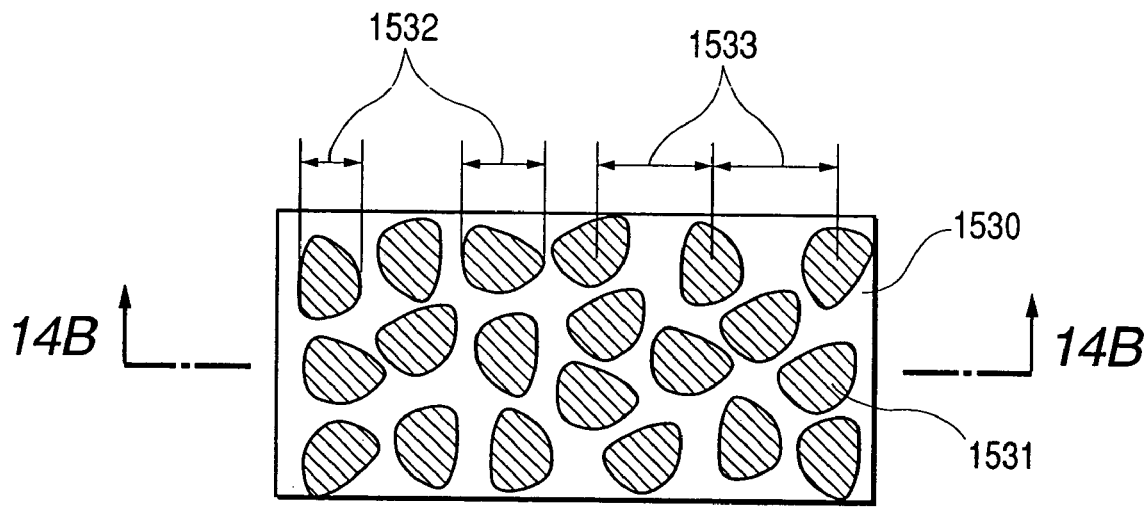
FIGS. 14A and 14B are schematic views illustrating examples of the prior art of a magnetic recording medium.
Figure 14B:
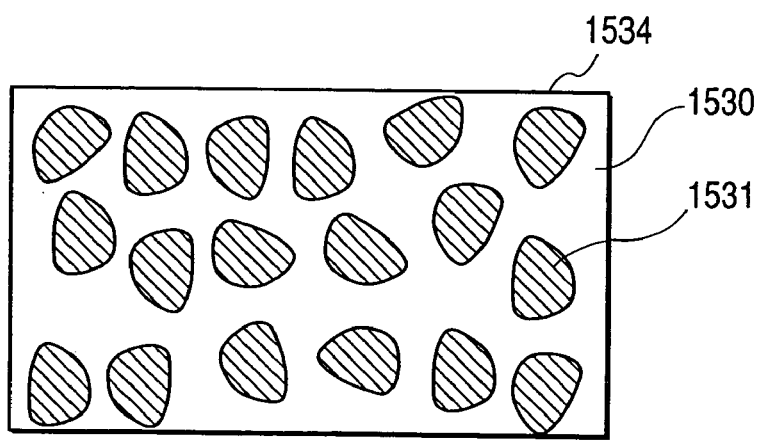

Thus, measures are taken to suppress movement of the magnetic domain walls such as a method of applying a bias magnetic field or eliminating the magnetic domain walls by adopting a granular film 1534 shown in a cross-sectional view 14B, which is FIG. 14A cut along a line 14B—14B (Japanese Patent Application Laid-Open No. 2001-101644). It is especially effective to adopt a granular film made up of a soft magnetic grain portion 1531 and non-magnetic material portion 1530 as shown in FIGS. 14A and 14B to eliminate the magnetic domain walls, but it is quite difficult to control the shape and size distribution of the soft magnetic grain portion 1531 or control grain density in the granular film. That is, it is desirable to make the diameter 1532 of soft magnetic grains and distance 1533 between soft magnetic grains uniform as shown in FIG. 14A. That is, according to the above-described prior art, the shape of soft magnetic grains in the granular film, size distribution and grain density distribution are problematic and it is difficult to make average permeability uniform.

The present inventor et al. have discovered that a preferable shape when soft magnetic materials are distributed in a non-magnetic base material is a columnar structure standing in the direction perpendicular to the substrate. In this case, a columnar soft magnetic material having a height equal to the film thickness exists in the direction perpendicular to the substrate and it is possible to suppress height fluctuations significantly. Furthermore, it is also possible to create a columnar soft magnetic material with small diameter fluctuations in the in-plane direction, too.

That is, this embodiment uses the structure 1001 shown in FIG. 1 as the member constituting the soft magnetic material layer.

Hereunder, this embodiment will be explained more specifically.

The third embodiment is a magnetic recording medium having a soft magnetic material layer and recording layer on a substrate, characterized in that the soft magnetic material layer is constructed by including columnar soft magnetic materials and a non-magnetic material area surrounding the soft magnetic materials. Here, the soft magnetic materials preferably stand in the direction perpendicular to the substrate.

The magnetic recording medium according to this embodiment will be explained based on the attached drawings.

Figure 15A:
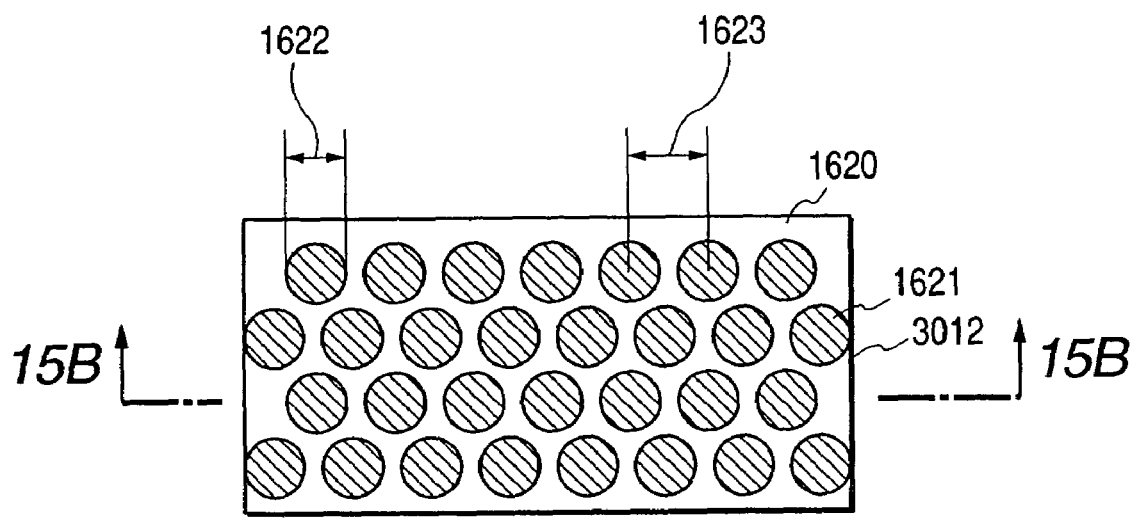
FIGS. 15A and 15B are schematic views illustrating the present invention.
Figure 15B:
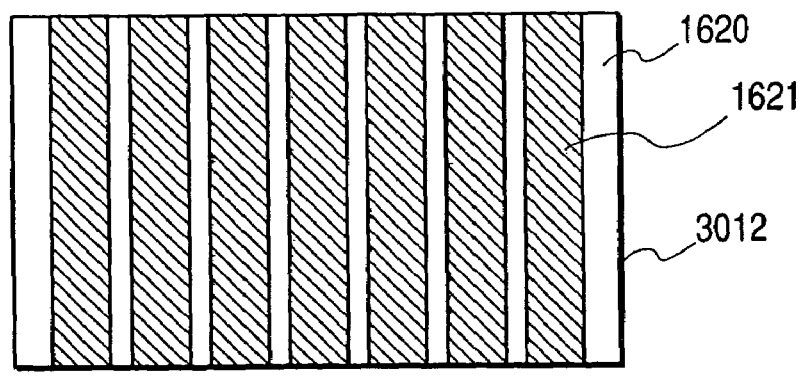

In FIG. 3, reference numeral 3010 denotes a substrate; 3011, a base layer A; 3012, a soft magnetic material layer; 3013, a base layer B; 3014, a recording layer; 3015, a protective layer; and 3016, a lubrication layer. Furthermore, in FIGS. 15A and 15B, reference numeral 1620 denotes a non-magnetic area; 1621, a columnar soft magnetic material; 1622, a diameter of the columnar soft magnetic material; and 1623, a distance between the columnar soft magnetic materials. FIG. 15B is a cross-sectional view of FIG. 15A cut along a line 15B—15B.

On the substrate 3010, the base layer A 3011, soft magnetic material layer 3012, base layer B 3013, recording layer 3014, protective layer 3015 and lubrication layer 3016 are placed in that order. Especially, the soft magnetic material layer 3012 consists of the non-magnetic area 1620 and columnar soft magnetic material 1621 as shown in FIGS. 15A and 15B and the diameter 1622 of those columnar magnetic materials is in the range 1 to 9 nm and the distance 1623 between the columnar soft magnetic materials is in the range 3 to 10 nm. These are values when aluminum is used as the first material and silicon is used as the second material of the structure 1001 (aluminum-silicon mixture) in FIG. 1. This embodiment will describe a case where this aluminum-silicon mixture is used as the member constituting the soft magnetic material layer, but it goes without saying that SiGe is also applicable instead of silicon.

The above-described base layer A 3011 consists of single or two or more non-magnetic conductive films provided between the substrate 3010 and soft magnetic material layer 3012. When the columnar soft magnetic materials 1621 are formed in the soft magnetic material layer 3012 using an electrodeposition method, the base layer A 3011 preferably serves as the electrode and plays the role of controlling orientation. Especially, it is preferable to use a metal film comprised of Pt, Pd, Cu, Ag, etc. Furthermore, this embodiment is not limited to a single-layer film but can also use a plurality of films depending on the purpose.

The above-described base layer B 3013 consists of a single layer or two or more non-magnetic conductive films provided between the soft magnetic material layer 3012 and recording layer 3014, and preferably plays the role of controlling orientation of the recording layer 3014. It is especially preferable to use a metal film comprised of Pt, Pd, Cu, Ag, etc. Especially, it is preferable to provide orientation like these (111) plane and (001) plane. Therefore, it is also possible to add a layer to control orientation of a metal film such as MgO beforehand and use a plurality of films as the base layer.

As the above-described substrate 3010, any substrate having a flat surface can be used, but it is especially preferable to use glass, aluminum, carbon, plastics, MgO, Si, etc., as the substrate. In the case of an aluminum substrate, it is desirable to form a NiP film as the base layer using a plating method, etc., to secure hardness.

In the above-described soft magnetic material layer 3012, silicon or its oxide, nitride, etc., is used as the non-magnetic area 1620. Especially, a formation method using annealing in an oxygen atmosphere or ammonium atmosphere may be used or it is also possible to oxide silicon by oxidation through anodization in a solution of sulfuric acid, oxalic acid or phosphoric acid. That is, a structure in which columnar aluminum is distributed in a silicon area is prepared, the aluminum portion is removed and the aluminum portion is replaced by the soft magnetic material.

The columnar soft magnetic material 1621 is preferably comprised of CoFe, NiFe, etc. Furthermore, the silicon portion of the non-magnetic area 1620 is preferably comprised of $Al_xSi_{1-x}$ (x=0.01 to 0.2). It is also preferably comprised of oxide of these substances and the value y of $(Al_xSi_{1-x})_yO_{1-y}$ (x=0.01 to 0.2) is not particularly limited.

The above-described recording layer 3014 has an $L1_0$-ordered structure predominantly comprised of $Co_{50}Pt_{50}$, $Fe_{50}Pt_{50}$ or $(CoFe)_{50}Pt_{50}$ and has a columnar shape of approximately 1 to 9 nm in diameter and preferably has a structure with one column separated from another 3 to 10 nm by the non-magnetic material. Furthermore, it is also possible to construct the recording layer by including at least one of $M_xPt_{1-x}$ (M=Fe, Co, Ni). By the way, x is in the range 0.3 to 0.7 or more preferably 0.4 to 0.6.

The above-described protective layer 3015 is preferably comprised of a carbon film and especially DLC (diamond-like carbon).

The above-described lubrication layer 3016 is preferably a commercially available product applied to a hard disk or the like.

<Method for Manufacturing Perpendicular Magnetic Recording Medium>

Hereunder, the method for manufacturing a perpendicular magnetic recording medium of the present invention will be explained in detail.

FIG. 16 is a process chart showing an embodiment of the method for manufacturing a perpendicular magnetic recording medium according to this embodiment. In FIG. 16, the method for manufacturing a perpendicular magnetic recording medium of the present invention is characterized by comprising the following steps 16(*a*) to 16(*d*):

Step 16(*a*): A base layer A is formed on a substrate.

Step 16(*b*): Next, columnar structure portions comprised of aluminum and a non-magnetic area predominantly comprised of silicon arranged in such a way as to surround the columnar structure portions are formed on the substrate through the process of simultaneous stacking of aluminum and silicon in a non-equilibrium state.

Step 16(*c*): This step consists of a step of replacing the columnar structure portions predominantly comprised of aluminum by the columnar soft magnetic material. By immersing the columnar structure portions in an acid solution, only the structure portions predominantly comprised of aluminum are subjected to etching to form columnar micropores or only the columnar structure portions predominantly comprised of aluminum are subjected to etching through anodization in an acid solution to form columnar micropores, and the micropores are filled with soft magnetic materials to form a soft magnetic material layer.

Step 16(*d*): On the soft magnetic material layer, a base layer B, recording layer, protective layer and lubrication layer are formed in that order.

Next, the above-described steps will be explained in a sequential order.

Step 16(*a*): Base Layer Formation Step

A base layer A is formed on the substrate. It is preferable to form the base layer A by forming a metal film comprised of Pt, Pd, Cu, Ag, etc., using a sputtering method. Furthermore, a single or a plurality of films can also be used. However, with regard to the film formation method, any means can be selected if it can at least form the film flatly and the method is not limited to only the sputtering method.

Step 16(*b*): Aluminum-Silicon Layer Formation Step

Next, an aluminum-silicon structure comprising columnar structure portions predominantly comprised of aluminum and a silicon area (non-magnetic area) predominantly comprised of silicon arranged in such a way as to surround the columnar structure portions is formed on the substrate through the process of simultaneous stacking of aluminum and silicon in a non-equilibrium state.

The present invention is especially characterized by a step of forming an aluminum-silicon layer, and so this step will be explained below.

An aluminum-silicon layer is formed on the base layer A of the substrate using a film formation method of forming substances with aluminum and silicon in a non-equilibrium state. Here, an example of using a sputtering method will be shown as a film formation method for forming substances in a non-equilibrium state.

As shown in FIG. 12, on the base layer A 3011 formed on the substrate 3010, an aluminum-silicon layer 1835 is formed using a magnetron sputtering method, which is a film formation method for forming substances in a non-equilibrium state. The aluminum-silicon layer 1835 is constructed of aluminum columnar structures 1837 predominantly comprised of aluminum and a silicon area 1838 predominantly comprised of silicon surrounding the aluminum columnar structures 1837.

Using FIG. 2, the method of forming an aluminum-silicon layer according to the sputtering method as the film formation method in a non-equilibrium state will be explained. By the way, in FIG. 2, reference numeral 1003 denotes the substrate and 2003 denotes the sputtering target. Use of the sputtering method allows the proportion between aluminum and silicon to be changed easily. As shown in FIG. 2, an aluminum-silicon layer is formed on the substrate 1003 (through the base layer as required) using the magnetron sputtering method, which is a film formation method for forming substances in a non-equilibrium state.

Silicon and aluminum as raw materials are provided by placing the silicon chips 2002 on the aluminum target 2003 as shown in FIG. 2. In FIG. 2, a plurality of silicon chips are placed, but the invention is of course not limited to this. Even a single silicon chip is acceptable if it at least allows desired film formation. However, it is preferable to place silicon chips symmetrically with respect to the substrate 1003 to uniformly distribute columnar structures containing uniform aluminum within the silicon area.

Furthermore, it is also possible to use a calcinated product resulting from calcination of predetermined amounts of aluminum and silicon powders as the target material for film formation.

Furthermore, it is also possible use a method of preparing an aluminum target and a silicon target separately and sputtering both targets simultaneously.

The amount of silicon formed in the film is 20 to 70 atomic % with respect to the total amount of aluminum and silicon, preferably 25 to 65 atomic %, and more preferably 30 to 60 atomic %. If the amount of silicon is within such a range, it is possible to obtain an aluminum-silicon layer in which aluminum columnar structures are distributed in the silicon area.

Furthermore, the substrate temperature is set to 200° C. or less or preferably 100° C. or less.

If an aluminum-silicon layer is formed using such a method, aluminum and silicon become a eutectic organization in a quasi-stable state and aluminum forms a columnar structure at a level of several nm and is separated from silicon in a self-organizing manner. Aluminum at that moment is almost cylindrical and its pore diameter is, for example, 1 to 10 nm and their distance is, for example, 3 to 15 nm.

The amount of silicon of the aluminum-silicon layer can be controlled by changing, for example, the number of silicon chips placed on the aluminum target.

When film formation is performed in a non-equilibrium state, and especially when the sputtering method is used, the pressure in the reactor when an argon gas is put is preferably set to approximately 0.2 to 1 Pa. However, the present invention is not particularly limited to this and any pressure is acceptable if it allows argon plasma to be formed stably.

With regard to the film formation method for forming substances in a non-equilibrium state, a sputtering method is preferred, but any film formation method for forming substances in a non-equilibrium state such as resistance heating vapor deposition and electron beam vapor deposition (EB vapor deposition) is applicable.

Furthermore, as a film formation method, it is also possible to use a simultaneous film formation process for forming silicon and aluminum simultaneously or a multilayer formation process of stacking silicon and aluminum by several atomic layers at a time.

The aluminum-silicon layer 1835 formed in the above-described way is provided with the aluminum columnar structures 1837 predominantly comprised of aluminum and the silicon area 1838 predominantly comprised of silicon surrounding the aluminum columnar structures 1837.

The columnar structures 1837 containing aluminum are predominantly comprised of aluminum, but they can also contain other elements such as silicon, oxygen and argon if at least columnar microstructures can be obtained. Here, as the predominant component, the proportion of aluminum in the composition ratio of the columnar structure portions is 80 atomic % or above or preferably 90 atomic % or above. In this case, it is important that the composition ratio allow easy dissolution in acid.

Furthermore, the composition of the silicon area 1838 surrounding the aluminum columnar structures is predominantly comprised of silicon, but various elements such as aluminum, oxygen and argon can also be contained if at least columnar microstructures can be obtained. By the way, as the main component, the proportion of silicon at the composition ratio of the silicon area is 80 atomic % or above, preferably 80 to 98 atomic % and more preferably 93 to 98 atomic %.

As described above, by sputtering aluminum and silicon simultaneously on the substrate, a anluminum-silicon structure consisting of an infinite number of columnar aluminum portions standing in the direction perpendicular to the substrate and a silicon portion placed in such a way as to surround the sides of the columnar aluminum portions is formed. The diameter of columnar aluminum in this case is preferably 1 to 9 nm and the distance between columnar aluminum portions is preferably 3 to 10 nm. These diameter and distance are determined by the composition ratio of aluminum to silicon.

The silicon area 1838 surrounding the above-described aluminum columnar structures becomes a non-magnetic material area surrounding the columnar soft magnetic materials. The silicon area 1838, that is, the non-magnetic material area, preferably has a composition of $Al_xSi_{1-x}$. X is 0.01 to 0.2, or preferably 0.02 to 0.07. Of course, it is also preferable that Al be not substantially included in the silicon area.

Step 16(c): Step of Replacing the Columnar Structure Portion by the Columnar Soft Magnetic Material Next, a step of replacing the columnar structure portion by the columnar soft magnetic material will be performed. This step can be performed using the following two methods:

One is a method of etching only the columnar structures comprised of aluminum immersed in an acid solution and forming columnar micropores. By immersing the columnar structures in a solution such as a phosphoric acid, which does not dissolve silicon but dissolves only aluminum, it is possible to remove aluminum and form micropores.

The other is a method of etching only the columnar structures predominantly comprised of aluminum in an acid solution through anodization to form micropores. Aluminum is eluted in a solution such as sulfuric acid through anodization to form micropores. In this case, the silicon portion is also oxidized. In this case, the temperature of the anodization solution can be set to any value, but 10° C. to 30° C. is preferable. Furthermore, there is no restriction on concentration and up to 0.3 mol/l to 7 mol/l is available. Furthermore, the anodization voltage is preferably 10 V or less. It is preferably 2 V especially when contact with the base layer A 3011 is weak.

Next, the columnar micropores formed are filled with soft magnetic materials to form a soft magnetic material layer. It is possible to immerse the columnar micropores in a soft magnetic material plating liquid and fill the micropores with soft magnetic materials using a plating method. That is, it is possible to use all platable soft magnetic materials. Especially, CoFe and NiFe are effective from the standpoint of plating. At this time, it is preferable to use the base layer A 3011 as an electrode for electrolytic plating or as a catalyst for electroless plating.

Furthermore, when filled according to the electrodeposition method, the soft magnetic material overflowed over the micropores is preferably subjected to precision polishing using diamond slurry, colloidal silica, etc., to make its Rms (root mean square) 1 nm or less.

Step 16(d): Step of Sequentially Forming Base Layer B, Recording Layer, Protective Layer and Lubrication Layer on the Soft Magnetic Layer It is preferable to form the above-described base layer B using a sputtering method, form the protective layer using a plasma CVD method or sputtering method. Furthermore, it is also possible to use a single or a plurality of films. With regard to the recording layer, it is also possible to form magnetic materials of $Co_{50}Pt_{50}$, $Fe_{50}Pt_{50}$ or $(CoFe)_{50}Pt_{50}$, etc., using the same manufacturing method as that for the soft magnetic layer of the present invention. Furthermore, it is preferable to form a lubrication layer by applying dip coating or spin coating to a lubrication material.

By the way, this embodiment has described the case where the above-described AlSi structure is used to form a soft magnetic material layer, but it goes without saying that this AlSi structure is diverted to other parts, for example, the recording layer itself.

Using the perpendicular magnetic recording medium according to this embodiment as a magnetic recording/reproduction apparatus requires the inclusion of a read/write magnetic head 8063, a drive control apparatus such as a motor, a signal processing circuit, a dust-proof case, etc., in addition to the above-described perpendicular magnetic recording medium 8061 as shown in FIG. 8. However, with the magnetic recording/reproduction apparatus, driving of the perpendicular magnetic recording medium is not limited only to rotation or driving of the head is not limited only to sliding on the circumference.

Furthermore, using the above-described magnetic recording/reproduction apparatus as an information processing apparatus requires the provision of a memory section 9074, a calculation section 9073, a power supply 9075, an external input/output section 9076 and wires 9077 to connect these sections in addition to a magnetic recording/reproduction apparatus 9072 as shown in FIG. 9. However, the information processing apparatus may be either wired or wireless. Reference numeral 9071 denotes a housing.

Furthermore, the porous body applicable to this embodiment may be comprised of oxide or non-oxide as required. For example, the porous body may also be comprised of amorphous silicon or the micropore walls may be selectively comprised of oxide.

EMBODIMENTS

Embodiment 1

Light-Emitting Device

This embodiment will describe a case where pores formed by removing the columnar members 1000 from the structure

1001, which has been explained using FIG. 1, are filled with a luminescent material to create a light-emitting device. The following explanation will describe an example where aluminum is used as the first material to form the columnar members and silicon is used as the area surrounding the columnar members in the structure 1001, but as already described, various materials can be selected if the columnar members can be selectively removed from the structure. This will apply to all the following embodiments.

First, an AlSi structure having a film thickness of 50 nm is prepared on a glass substrate on which Pd of 20 nm is formed using a sputtering method. At this time, with regard to the condition of the AlSi film, it was confirmed that a structure consisting of columnar aluminum standing in the direction perpendicular to the substrate and silicon placed in such a way as to surround the sides of the columnar aluminum was formed in a self-organizing manner. The diameter of the columnar aluminum was 4 nm and the distance between the columnar aluminum portions was 7 nm. This structure was immersed in 5 wt % (weight %) phosphoric acid and the aluminum portions were removed by etching to form nano-holes of 4 nm. At this time, since the Pd layer was exposed at the bottom of each hole, it is possible to perform ZnO electrodeposition using this Pd layer as an electrode.

Electrodeposition was performed using a 60° C., 0.1 mol/l aqueous solution of zinc nitrate with oxidized AlSi nano-holes placed at the cathode and with a voltage of –0.5 V applied. In this case, electrodeposition ended when it overflowed from the holes and the overflow portion was removed by polishing. On the other hand, in addition to etching in phosphoric acid, AlSi nano-holes are also usable with $(Al_xSi_{1-x})_yO_{1-y}$ having micropores oxidized by anodization or annealing in an oxygen atmosphere.

Furthermore, the electrodeposition solution is not limited to an aqueous solution of zinc sulfate, but chloride-based solution, etc., may also be used. Especially, it is also possible to use a small amount of element, for example, of approximately 0.005 mol/l solved in a soluble organic solvent instead of an aqueous solution.

This sample was subjected to a photoluminescence measurement to evaluate the light-emitting characteristic. 325 nm He—Cd laser was used as an excitation light source, the laser beam was introduced from the top surface of the sample, that is, in parallel to the nano-holes and then it was allowed to go out in the same direction.

As a result, it was confirmed that the light emitted from this sample had a shorter wavelength than the wavelength of the light emitted from the ZnO bulk. This has something to do with the fact that the sizes of crystal grains are restricted by AlSi nano-holes and the wavelength of light emitted can be controlled by the sizes of holes.

Embodiment 2

Magnetic Device

An AlSi structure having a film thickness of 50 nm was prepared on a glass substrate on which 20 nm Pt was formed. At this time, with regard to the condition of the AlSi film, it was confirmed that a structure consisting of columnar aluminum standing in the direction perpendicular to the substrate and silicon placed in such a way as to surround the sides of the columnar aluminum was formed in a self-organizing manner. The diameter of the columnar aluminum was 4 nm and the distance between the columnar aluminum portions was 7 nm. This structure was subjected to anodization by applying a voltage of 2 V thereto in an aqueous solution of sulfuric acid of 7 mol/l at 20° C. As a result, the aluminum portions were removed, the silicon portion was oxidized and an $(Al_xSi_{1-x})_yO_{1-y}$ film with micropores was formed. A composition analysis proved that x was in the range 0.01 to 0.2 though there were slight fluctuations. Next, the structure was immersed in an aqueous solution of sodium hydroxide of 1 mol/l for two minutes and micropores at the bottom were homogenized. Since this caused the Pt layer to expose at the bottom of each hole, electrodeposition of a magnetic material was conducted using this Pt layer as an electrode. As in the case of Embodiment 1, AlSi nano-holes formed by etching with phosphoric acid were also usable.

First, a 1:1 mixture of nickel sulfate (II) septahydrate and iron sulfate (II) septahydrate was used to fill NiFe, and electrodeposition was performed with a voltage of –1.0 V applied to an Ag/AgCl reference electrode at 24° C. Furthermore, for electrodeposition of FePt, a 10:1 mixture of 0.3 mol/l iron sulfate (II) septahydrate and 0.03 mol/l platonic acid hexachloride was used and electrodeposition was performed with a voltage of –1.5 V applied to an Ag/AgCl reference electrode at 24° C.

When these magnetic characteristics were observed with a hysteresis curve, NiFe showed a coercive force of approximately 10 Oe exhibiting a soft magnet-like characteristic. Furthermore, since FePt was converted to an ordered alloy through annealing processing, it showed a coercive force as high as 6 kOe in the direction perpendicular to the substrate with respect to an applied magnetic field of 13 kOe, while the coercive force was weak in the in-plane direction of the substrate and exhibited high perpendicular magnetic anisotropy.

Thus it is apparent that using the structure shown in FIG. 1, the present invention can provide a magnetic device as a function device.

Embodiment 3

This embodiment relates to a method for manufacturing recording layers and their respective shapes and orientations.

Pt, Pd, Cu, Ir or Rh was selected from among precious metals and Cu as a base layer using a sputtering vapor deposition method, films of these metals of 5 nm in thickness were formed separately on a glass substrate on the surface of which an MgO film was formed and an AlSi structure ($Al_{50}Si_{50}$ layer (composition of Al: 50 atomic %, Si: 50 atomic %)) of a film thickness of 200 nm was formed on each of all these metals.

The sputtering target used consists of six silicon chips of 15 mm per side placed on a circular aluminum target having a diameter of 4 inches (101.6 mm). As the sputtering conditions, an RF power supply was used with Ar flow rate: 50 sccm, discharge pressure: 0.7 Pa, power supplied: 1 kW. Furthermore, the substrate temperature was set to a room temperature (25° C.).

By the way, the aluminum target provided with six silicon chips was used as the target, but the number of silicon chips is not limited to this and it changes depending on the sputtering condition and any number is acceptable if the composition of the AlSi layer is close to a predetermined content of silicon. Furthermore, the target is not limited to the one with silicon chips placed on an aluminum target, and the target can be the one with aluminum chips placed on a silicon target or a target resulting from sintering of silicon and aluminum may also be used.

At this time, with regard to the condition of the AlSi film, it was confirmed that a structure consisting of columnar aluminum portions standing in the direction perpendicular to the substrate and a silicon portion placed in such a way as to surround the sides of the columnar aluminum was formed in a self-organizing manner, as shown in FIG. 1. The diameter of the columnar aluminum was 4 nm and the distance between the columnar aluminum portions was 7 nm.

Then, anodization was conducted with a voltage of 5 V applied in an aqueous solution of sulfuric acid of 7 mol/l at 20° C. As a result, the columnar aluminum portions were removed, the silicon portion was oxidized and an $(Al_xSi_{1-x})_yO_{1-y}$ film with micropores was formed. A composition analysis proved that x was in the range 0.01 to 0.2 though there were slight fluctuations. Next, the structure was immersed in an aqueous solution of sodium hydroxide of 1 mol/l for two minutes and micropores at the bottom were homogenized. At this time, the Pt, Pd, Cu, Ir and Rh films were oriented toward the (001) direction with respect to the direction perpendicular to the substrate and the respective planes of Pt, Pd, Cu, Ir and Rh were exposed at the bottom of nano-holes, keeping favorable conductivity.

As shown above, as a typical example, the micropores of a sample with a base layer of Pt were filled with hard magnetic materials CoPt and FePt. Here, for electrodeposition of CoPt, 5 ml of a 0.003 mol/l aqueous solution of platinic acid hexachloride hexahydrate was mixed with 25 ml of an aqueous solution of 0.3 mol/l cobalt sulfate (II) septahydrate, 30 g/l of boric acid and 50 g/l of magnesium sulfate septahydrate, and this mixture was used at 24° C. For electrodeposition of FePt, cobalt sulfate of the above-described CoPt solution replaced by 0.3 mol/l iron sulfate (II) septahydrate was used.

Electrodeposition was carried out using Ag/AgCl as a reference electrode in the above solution while stirring it at −2.0 V, −1.2 V and −0.6 V.

Furthermore, the electrodeposit overflowed over the surface of these samples was polished and removed using diamond slurry with a grain diameter of ¼ μm. At this time, Rms of the surface was 1 nm or less.

When the above-described sample was observed using a field emission type scanning electron microscope (FE-SEM), it was confirmed through observation of the cross-section that CoPt and FePt existed in the micropores and nano-holes demonstrated excellent linearity.

Considering the influence of Pt of the base layer, the result of these composition analyses using the ICP shows compositions in Table 2 below:

TABLE 2

|  | −0.6 V | −1.2 V | −2.0 V |
|---|---|---|---|
| Co composition | 0.09 | 0.52 | 0.80 |
| Pt composition | 0.91 | 0.48 | 0.20 |
| Fe composition | 0.06 | 0.48 | 0.77 |
| Pt composition | 0.94 | 0.52 | 0.23 |

As set out above, the sample subjected to electrodeposition showed a low composition of Co and Fe at −0.6 V, and a sufficiently large composition at −2.0 V and was considerably deviated from the composition of the $L1_0$-ordered structure. At −1.2 V, diffraction of fcc (002) was observed mainly in both CoPt and FePt.

For the sample subjected to electrodeposition at −1.2 V, annealing was fully applied to CoPt at 700° C., FePt at 650° C. in a vacuum, and then an X-ray diffraction measurement was conducted. Then, peaks of $L1_0$-ordered structures (001) and (002) were observed at both CoPt and FePt at the sample subjected to electrodeposition at −1.2 V. When corrected for CoPt with a diffraction intensity ratio of the powder samples in JCPDS, the c-axis of 78% of the whole was oriented in the direction perpendicular to the substrate and the rest was oriented in other directions. That of FePt was 74%. Furthermore, when the base layer is the Pt (111) plane, CoPt (111) of the $L1_0$-ordered structure appears preferentially, and therefore by setting the base layer to Pt (001), it is possible to confirm that the c-axis of the $L1_0$-ordered structure is preferentially oriented toward the direction perpendicular to the substrate.

Embodiment 4

In this embodiment, a measurement similar to that in Embodiment 3 was conducted in the case where the base layer below the recording layer has an ordered structure.

An example where FePt is used as the base layer will be explained below.

First, on a glass substrate on the surface of which an MgO film is formed, 5 nm (film thickness) FePt of an $L1_0$-ordered structure, 5 nm CuPt of an $L1_1$-ordered structure and 5 nm $FePt_3$ of an $L1_2$-ordered structure were formed separately using a sputtering apparatus and then AlSi structures are formed on all films in a thickness of 200 nm using the sputtering method.

These three samples were subjected to anodization under the same conditions as those in Embodiment 1. As in the case of the Pt base layer, it was confirmed that the square array plane was oriented in the direction perpendicular to the substrate and the planes of the respective base layers were exposed, exhibiting good conductivity at the bottom of nano-holes. Especially in the case of the $L1_0$-ordered structure, its c-axis was confirmed to be oriented toward the direction perpendicular to the substrate.

As shown above, in the case of the base layer having the $L1_0$-ordered structure, hard magnetic material FePt was filled into the nano-holes. Here, for electrodeposition of FePt, 5 ml of a 0.003 mol/l aqueous solution of platinic acid hexachloride hexahydrate was mixed with 25 ml of an aqueous solution of 0.3 mol/l iron sulfate (II) septahydrate, 30 g/l of boric acid and 50 g/l of magnesium sulfate septahydrate and the mixture was used at 24° C.

Electrodeposition was carried out in the above-described solution using Ag/AgCl as a reference electrode at −1.2 V. Furthermore, the electrodeposit overflowed over the surface of these samples was polished and removed using diamond slurry having a grain diameter of ¼ μm. At this time, Rms of the surface was 1 nm or less.

The result of an X-ray diffraction measurement mainly showed peaks of an fcc structure-FePt (002). These samples were subjected to full annealing at 650° C. in a vacuum, and then an X-ray diffraction measurement was conducted again. Then, peaks of $L1_0$-ordered structures FePt (001) and (002) were observed and when corrected with a diffraction intensity ratio of the powder samples in JCPDS, it is possible to confirm that the c-axis of 80% of the whole is oriented in the direction perpendicular to the substrate.

As set out above, when the $L1_0$-ordered structure FePt is used, it is possible to confirm that the c-axis of the $L1_0$-ordered structure FePt is also preferentially oriented toward the direction perpendicular to the substrate.

Embodiment 5

This embodiment relates to a non-magnetic material in the-configuration of a filler in micropores, manufacturing method and orientation of soft magnetic material portions and resulting orientation of a hard magnetic material ($L1_0$-ordered structure) portion.

Figure 6E:
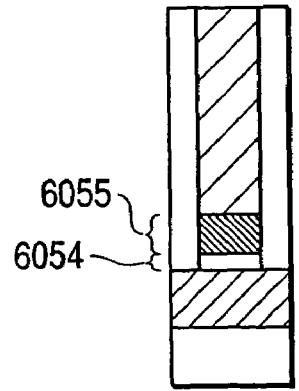
Figure 7F:
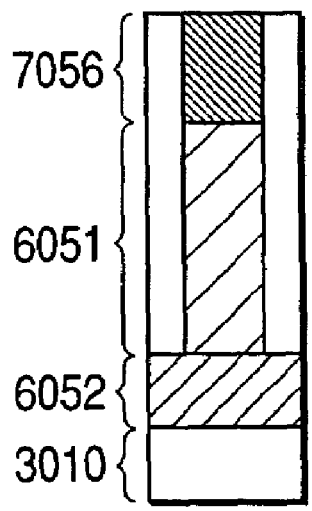
FIGS. 7F and 7G illustrate examples of a filler to fill the inside of pores according to the present invention.
Figure 7G:
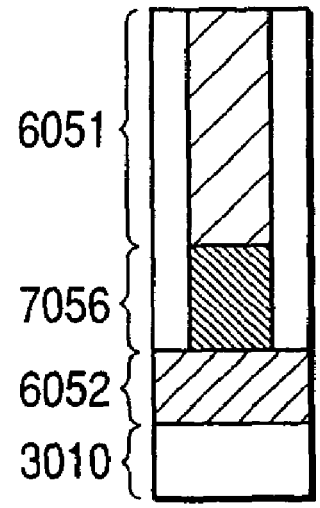

First, as shown in FIGS. 6A to 6E and FIGS. 7F and 7G, in addition to the only hard magnetic material ($L1_0$-ordered structure) 6051 of Embodiment 3 (FIG. 6A), the configuration of the filler can take various modes such as the hard magnetic material ($L1_0$-ordered structure)/non-magnetic material 6054 in FIG. 6B, or hard magnetic material ($L1_0$-ordered structure)/soft magnetic material 6055 in FIG. 6C or hard magnetic material ($L1_0$-ordered structure)/non-magnetic material 6054/soft magnetic material 6055 in FIG. 6D or hard magnetic material ($L1_0$-ordered structure)/soft magnetic material 6055/non-magnetic material 6054 in FIG. 6E or hard magnetic material ($L1_2$-ordered structure) 7056/hard magnetic material ($L1_0$-ordered structure) 6051 in FIG. 7F or hard magnetic material ($L1_0$-ordered structure) 6051/hard magnetic material ($L1_2$-ordered structure) 7056 in FIG. 7G, etc.

First, as shown in Embodiment 3, five samples with micropore using Pt, Pd, Cu, Ir and Rh were prepared as the base layer below the recording layer and electrodeposition was carried out for non-magnetic material and soft magnetic material separately or with both substances stacked together. As a result, it was confirmed that the orientation after electrodeposition remained the same as that of the base layer, that is, (001)-oriented.

This embodiment will especially detail the case where Pt is used for the base layer.

First, for electrodeposition of Pt as the non-magnetic material, electrodeposition was carried out using a 0.03 mol/l aqueous solution of platinic acid hexachloride hexahydrate by applying a voltage of −0.5 V to an Ag/AgCl reference electrode at 24° C.

NiFe was used as the soft magnetic material, nickel sulfate (II) septahydrate and iron sulfate (II) septahydrate were mixed at a ratio 1:1 and electrodeposition was also carried out by applying a voltage of −1.0 V to the Ag/AgCl reference electrode at 24° C.

Furthermore, both substances were stacked together one layer each in different baths, that is, two kinds of non-magnetic material/soft magnetic material and soft magnetic material/non-magnetic material were created under the above-described condition.

Furthermore, in the bath where the above-described Pt and NiFe electrodeposition solutions were mixed at a ratio 1:10, if electrodeposition is carried out on the Ag/AgCl reference electrode at −0.5 V for the non-magnetic material layer and −1.0 V for the soft magnetic material layer, it is possible to realize stacking without changing the electrodeposition solution. However, mixing of a tiny amount of the other component is unavoidable.

The result of the above-described X-ray diffraction on the sample confirmed that single Pt was most fcc (001)-oriented in the direction perpendicular to the substrate and when corrected with the diffraction intensity from the powder sample of JCPDS, it is possible to confirm that 94% is oriented. Furthermore, it is possible to confirm from all combinations, especially samples for which electrodeposition was carried out from a mixed bath that 80% or more of the whole was fcc (001)-oriented in direction perpendicular to the substrate.

Furthermore, the result of an X-ray diffraction when FePt, which is a hard magnetic material ($L1_0$-ordered structure), is added to the last layer under the above-described condition is shown. As the FePt electrodeposition condition, the optimal condition of −1.2 V in Embodiments 3 and 4 was used and then heating was applied through RTA (Rapid Thermal Annealing) at 650° C. for 2 minutes. This is intended to suppress mutual diffusion with the non-magnetic or soft magnetic material layer.

Furthermore, it was confirmed that in the case of the configuration shown in FIG. 6B, if annealing was applied in a vacuum at 700° C. for one hour, for example, mutual diffusion of fillers Pt and FePt advanced as shown in FIG. 7G. Furthermore, it was confirmed that using a greater proportion of Fe than 1:1 in the composition of FePt resulted as shown in FIG. 7F with the same annealing. Thus, it was also confirmed that not only the $L1_0$-ordered structure of the hard magnetic but also $L1_2$-ordered structure material appeared as the effect of annealing.

From the above-described result, it was observed that when the influence of mutual diffusion was small, there was no diffraction peak from the $L1_2$-ordered structure $FePt_3$ generated by the diffusion effect and (001) and (002) peaks from the $L1_0$-ordered structure FePt were observed. Using the degree of the (002)-orientation as a comparative example, the ratio relative to this comparative example is shown in Table 3 regarding the comparative example as 1.

TABLE 3

| Comparative Example | Pt only | NiFe only | Pt/NiFe | NiFe/Pt | Pt/NiFe mixed bath | NiFe/Pt mixed bath |
|---|---|---|---|---|---|---|
| 1 | 1.10 | 1.03 | 1.02 | 1.02 | 1.01 | 1.00 |

As set out above, it was possible to confirm that the non-magnetic material and soft magnetic material layers in the configuration of fillers in micropores influenced the c-axis orientation of the hard magnetic material layer, too. It is estimated that after anodization, part of the Pt (001) surface of the base layer was oxidized or some oxides still remained and covering them with a material having the same crystalline structure improved the orientation in the subsequent layers. Furthermore, the same effects are obtained in other base layers.

Embodiment 6

This embodiment relates to the soft magnetic material layer placed below the base layer.

After a NiFe soft magnetic material layer with a film thickness of 2 μm was formed on the base layer MgO (001) plane of a Si substrate, a Pt base layer was formed and it was confirmed that this Pt base layer was (001)-oriented from an X-ray diffraction in the direction perpendicular to the substrate. Furthermore, after forming a 200 nm AlSi film using a sputtering method, anodization was carried out in a 7 mol/l aqueous solution of sulfuric acid at 20° C. with an applied voltage of 5 V to form a recording layer matrix. Furthermore, when its cross-section was observed using an FE-SEM (field emission type scanning electron microscope), the bottom of the micropores was uniform as in the case of no NiFe layer.

Furthermore, after forming FePt of an $L1_0$-ordered structure in micropores of the recording layer, diamond-like carbon (DLC) of the protective layer was formed into a film of 4 nm in thickness, a lubrication layer comprised of PFPE (perfluoropolyether) was formed and a magnetic recording medium was formed. When recording is performed with the magnetic head contacting this magnetic recording medium, it is possible to confirm that the intensity of the magnetic field necessary for recording is 0.82 times that of the sample with no soft magnetic material layer below the Pt base layer and the soft magnetic material layer promotes concentration of magnetic flux.

Furthermore, PW50, a half-width of an area of transition between recording bits, was measured. As a result of a comparison with a case with no soft magnetic material layer, PW50 was 1.03, assuming that PW50 with the presence of a soft magnetic material layer is 1.0. Therefore, it is possible to confirm that the flux from the head does not expand from the soft magnetic material layer and the transition area also becomes sharper.

As set out above, it is appreciated that it is effective to insert a NiFe soft magnetic material below the base layer.

Embodiment 7

This embodiment relates to the magnetic recording apparatus in the configuration shown in FIG. 8.

The magnetic recording medium of the present invention can record information according to the magnetization direction of an infinite number of fillers because the average diameter of columnar structures of fillers is as small as 9 nm or less.

Therefore, it is possible to form a magnetic recording apparatus by assembling the magnetic recording medium of the present invention into an apparatus made up of a magnetic recording medium drive section 8062, a magnetic head 8063, a magnetic head drive section 8064, and a signal processing section 8065 as shown in FIG. 8. However, with this embodiment, driving of the magnetic recording medium or driving of the magnetic head is not limited to only rotation or only sliding on a circumference, respectively.

Embodiment 8

This embodiment relates to an information processing apparatus.

Since the magnetic recording/reproduction apparatus 9072 according to Embodiment 7 can input/output information, as shown in FIG. 9, it is possible to form an information processing apparatus with the magnetic recording/reproduction apparatus 9072, memory portion 9074, calculation section 9073, external input/output section 9076, power supply 9075 and wires 9077 for connecting these sections housed in the housing 9071.

As shown in the above-described embodiment, the present invention can provide a method for manufacturing a magnetic recording medium enabling c-axis-orientation of micropores having an average diameter of 9 nm or less with respect to the orientation of a hard magnetic material filled into the micropores created using an AlSi structure. This is influenced by the fact that any one of Pt, Pd, Cu, Ir and Rh is used for the base layer and the base layer is (001)-oriented in the direction perpendicular to the substrate. Applying electrodeposition to the non-magnetic material layer of any one of Pt, Pd, Cu, Ir and Rh and NiFe soft magnetic material layer also makes it possible to improve the orientation of the $L1_0$-ordered structure MPt (M=Co, Fe, Ni) hard magnetic material.

As shown above, the configuration and manufacturing method of the present invention can realize a perpendicular magnetic recording medium incorporating the orientation of magnetic material, which has been considered difficult to implement, and using micropores with an average diameter of 9 nm or less. Furthermore, it is also possible to drive the magnetic recording/reproduction apparatus and the information processing apparatus in the configurations shown in FIG. 8 and FIG. 9.

Embodiment 9

This embodiment relates to a method for manufacturing recording layers and their respective shapes and orientations.

Pt, Pd, Cu, Ir or Rh was selected from among precious metals and Cu using a sputtering vapor deposition method, films of these metals of 5 nm in thickness were formed separately on a Si substrate on the surface of which an MgO film is formed, and an Al—SiGe structure of a film thickness of 200 nm was prepared for each of all these metals. At this time, with regard to the composition of Al and SiGe, SiGe accounted for 38 atomic % of the total amount.

As the sputtering target, two Si chips and two Ge chips of 15 mm per side placed symmetrically on a circular Al target with a diameter of 4 inches (101.6 mm) were used. As the sputtering conditions, an RF power supply was used with Ar flow rate: 50 sccm, discharge pressure: 0.7 Pa, power supplied: 300 W. Furthermore, the substrate temperature was set to a room temperature (25° C.).

By the way, the Al target provided with a total of four Si and Ge chips was used as the target, but the number of Si and Ge chips and their proportions are not limited to these and they change depending on the sputtering condition and any number of chips and proportions are acceptable if the composition of the Al—SiGe structure is close to a predetermined SiGe content. Furthermore, the target is not limited to the one with Si and Ge chips placed on the Al target. A target with Al chips placed on a SiGe target or a target with sintered Al, Si and Ge may also be used. Or SiGe chips may also be placed on an Al target.

At this time, with regard to the condition of the Al—SiGe film, it was confirmed that a structure consisting of columnar Al portions standing in the direction perpendicular to the substrate and a SiGe portion placed in such a way as to surround the sides of the columnar Al was formed in a self-organizing manner, as shown in FIG. 12. The diameter of the columnar Al was 6 nm and the distance between the columnar Al portions was 10 nm. Then, anodization was performed with a voltage of 2 V applied in an aqueous solution of sulfuric acid of 7 mol/l at 20° C. As a result, the columnar Al portions were removed, the SiGe portion was oxidized and a SiGe oxide film having micropores was formed. An analysis proved that Al was contained in a range of $0.01 \leq x \leq 0.2$ though there were slight fluctuations. Next, the structure was immersed in an aqueous solution of sodium hydroxide of 1 mol/l for two minutes and micropores at the bottom were homogenized. At this time, the Pt, Pd, Cu, Ir and Rh films were oriented in (001) direction with respect to the direction perpendicular to the substrate and the respective planes of Pt, Pd, Cu, Ir and Rh were exposed at the bottom of nano-holes, exhibiting favorable conductivity.

As shown above, as a typical example, the micropores of a sample with a base layer of Pt were filled with the hard magnetic materials CoPt and FePt. Here, for electrodeposition of CoPt, 5 ml of a 0.03 mol/l aqueous solution of platinic acid hexachloride hexahydrate was mixed with 25 ml of an aqueous solution of 0.3 mol/l cobalt sulfate (II)

septahydrate, 30 g/l of boric acid and 50 g/l of magnesium sulfate septahydrate, and the mixture was used at 24° C. For electrodeposition of FePt, cobalt sulfate of the above-described CoPt solution replaced by iron sulfate (II) septahydrate of 0.3 mol/l was used.

Electrodeposition was carried out using Ag/AgCl as a reference electrode in the above solution while stirring it at −2.0 V, −1.2 V and −0.6 V.

Furthermore, the electrodeposit overflowed over the surface of these samples was polished and removed using diamond slurry with a grain diameter of ¼ μm. At this time, Rms of the surface was 1 nm or less.

When the above-described sample was observed using a field emission type scanning electron microscope (FE-SEM), it was confirmed through observation of the cross-section that CoPt and FePt existed in the micropores and nano-holes showed excellent linearity.

Considering the influence of Pt of the base layer, the result of these composition analyses using the ICP shows compositions in Table 4 below:

TABLE 4

|  | −0.6 V | −1.2 V | −2.0 V |
| --- | --- | --- | --- |
| Co composition | 0.08 | 0.51 | 0.78 |
| Pt composition | 0.92 | 0.49 | 0.22 |
| Fe composition | 0.08 | 0.47 | 0.76 |
| Pt composition | 0.92 | 0.53 | 0.24 |

As set out above, the sample subjected to electrodeposition showed a low composition of Co and Fe at −0.6 V, and a sufficiently large composition at −2.0 V and the composition was considerably deviated from the composition of the $L1_0$-ordered structure. At −1.2 V, diffraction of fcc (002) was observed mainly in both CoPt and FePt.

For the sample subjected to electrodeposition at −1.2 V, annealing was fully applied to CoPt at 700° C., FePt at 650° C. in a vacuum, and then an X-ray diffraction measurement was conducted again. Then, peaks of $L1_0$-ordered structures (001) and (002) were observed at both CoPt and FePt at the samples subjected to electrodeposition at −1.2 V. When corrected for CoPt with a diffraction intensity ratio of the powder samples in JCPDS, the c-axis of 78% of the whole was oriented in the direction perpendicular to the substrate and the rest was oriented in other directions. That of FePt was 72%. Furthermore, when the base layer is the Pt (111) plane, CoPt (111) of the $L1_0$-ordered structure appears preferentially, and therefore by setting the base layer to Pt (001), it is possible to confirm that the c-axis of the $L1_0$-ordered structure is preferentially-oriented toward the direction perpendicular to the substrate.

Embodiment 10

In this embodiment, a measurement similar to that in Embodiment 9 was conducted in the case where the base layer below the recording layer had an ordered structure.

An example of FePt will be explained below.

First, on a Si substrate on the surface of which an MgO film is formed, 5 nm FePt of an $L1_0$-ordered structure, 5 nm CuPt of an $L1_1$-ordered structure and 5 nm $FePt_3$ of an $L1_2$-ordered structure were formed separately using a sputtering apparatus and then Al—SiGe structures of 200 nm in thickness were formed on all films using the sputtering method.

These three samples were subjected to anodization under the same conditions as those of Embodiment 1. As in the case of the Pt base layer, it was confirmed that the plane of the square array was oriented in the direction perpendicular to the substrate and the planes of the respective base layers were exposed, exhibiting good conductivity at the bottom of nano-holes. Especially in the case of an $L1_0$-ordered structure, its c-axis was confirmed to be oriented toward the direction perpendicular to the substrate.

As shown above, in the case of the base layer having an $L1_0$-ordered structure, hard magnetic material FePt was filled into the nano-holes. Here, for electrodeposition of FePt, 5 ml of a 0.03 mol/l aqueous solution of platinic acid hexachloride hexahydrate was mixed with 25 ml of an aqueous solution of 0.3 mol/l iron sulfate (II) septahydrate, 30 g/l of boric acid and 30 g/l of magnesium sulfate septahydrate and the mixture was used at 24° C.

Electrodeposition was carried out in the above-described solution using Ag/AgCl as a reference electrode at −1.2 V. Furthermore, the electrodeposit overflowed over the surface of these samples was polished and removed using diamond slurry having a grain diameter of ¼μm. At this time, Rms of the surface was 1 nm or less.

The result of an X-ray diffraction measurement mainly showed peaks of an fcc structure-FePt (002). These samples were subjected to full annealing at 650° C. in a vacuum, and then an X-ray diffraction measurement was conducted again. Then, peaks of $L1_0$-ordered structures FePt (001) and (002) were observed and when corrected with a diffraction intensity ratio of the powder samples in JCPDS, it is possible to confirm that the c-axis of 78% of the whole is oriented in the direction perpendicular to the substrate.

As set out above, it is possible to confirm that even when the $L1_0$-ordered structure FePt is used as the base layer, the c-axis of $L1_0$-ordered structure FePt is preferentially oriented in the direction perpendicular to the substrate.

Embodiment 11

This embodiment relates to a non-magnetic material in the configuration of fillers in micropores, manufacturing method and orientation of soft magnetic material portions and the resulting orientation of the hard magnetic material ($L1_0$-ordered structure) portion.

First, as shown in FIGS. 6A to 6E, in addition to the only hard magnetic material ($L1_0$-ordered structure) 6051 of Embodiment 1 (FIG. 6A), the configuration of the filler can take various modes such as the hard magnetic material ($L1_0$-ordered structure)/non-magnetic material 6054 in FIG. 6B, or hard magnetic material ($L1_0$-ordered structure)/soft magnetic material 6055 in FIG. 6C or hard magnetic material ($L1_0$-ordered structure)/non-magnetic material 6054/soft magnetic material 6055 in FIG. 6D or hard magnetic material ($L1_0$-ordered structure)/soft magnetic material 6055/non-magnetic material 6054 in FIG. 6E or hard magnetic material ($L1_2$-ordered structure) 7056/hard magnetic material ($L1_0$-ordered structure) 6051 in FIG. 7F or hard magnetic material ($L1_0$-ordered structure) 6051/hard magnetic material ($L1_2$-ordered structure) 7056 in FIG. 7G, etc.

First, as shown in Embodiment 9, five micropore samples using Pt, Pd, Cu, Ir and Rh as the base layer below the recording layer were prepared and electrodeposition was carried out for the non-magnetic material and soft magnetic material separately or with both substances stacked together. As a result, it was confirmed that the orientation after electrodeposition remained the same as that of the base layer, that is, (001)-oriented.

This embodiment will especially detail the case where Pt is used for the base layer.

First, for electrodeposition of Pt as the non-magnetic material, electrodeposition was carried out using a 0.03 mol/l aqueous solution of platinic acid hexachloride hexahydrate by applying a voltage of −0.5 V to an Ag/AgCl reference electrode at 24° C.

NiFe was used as the soft magnetic material, nickel sulfate (II) septahydrate and iron sulfate (II) septahydrate were mixed at a ratio 1:1 and electrodeposition was also carried out by applying a voltage of −1.0 V to the Ag/AgCl reference electrode at 24° C.

Furthermore, both substances were stacked together one layer each in different baths, that is, two kinds of non-magnetic material/soft magnetic material and soft magnetic material/non-magnetic material were created under the above-described condition.

Furthermore, in the bath where the above-described Pt and NiFe electrodeposition solutions were mixed at a ratio 1:10, if electrodeposition is carried out on the Ag/AgCl reference electrode at −0.5 V for the non-magnetic material layer and −1.0 V for the soft magnetic material layer, it is possible to realize stacking without changing the electrodeposition solution. However, mixing of a tiny amount of the other component is unavoidable.

The result of the above-described X-ray diffraction on the sample confirmed that single Pt was most fcc (001)-oriented in the direction perpendicular to the substrate and when corrected with the diffraction intensity from the JCPDS powder sample, it is possible to confirm 93% is oriented. Furthermore, it is possible to confirm from all combinations, especially samples for which electrodeposition was carried out from a mixed bath that 79% or more of the whole was fcc (001)-oriented in the direction perpendicular to the substrate.

Furthermore, the result of an X-ray diffraction when FePt, which is a hard magnetic material ($L1_0$-ordered structure), is added to the last layer under the above-described condition is shown. As the FePt electrodeposition condition, the optimal condition of −1.2 V in Embodiments 1 and 2 was used and then heating was applied through RTA at 650° C. for 2 minutes. This is intended to suppress mutual diffusion with the non-magnetic or soft magnetic material layer.

Furthermore, it was confirmed that in the case of the configuration as shown in FIG. 6B, if annealing was applied in a vacuum at 700° C. for one hour, for example, mutual diffusion of fillers Pt and FePt advanced as shown in FIG. 7G. Furthermore, it was confirmed that using a greater proportion of Fe than 1:1 in the composition of FePt resulted as shown in FIG. 7F with the same annealing. Thus, it was also confirmed that not only the $L1_0$-ordered structure of the hard magnetic material but also $L1_2$-ordered structure appeared as the effect of annealing.

From the above-described result, it was observed that when the influence of mutual diffusion was small, (001) and (002) peaks of the $L1_0$-ordered structure FePt were observed. Using the degree of the (002)-orientation as a comparative example, the ratio relative to this comparative example is shown in Table 5 regarding the comparative example as 1.

TABLE 5

| Comparative Example | Pt only | NiFe only | Pt/NiFe | NiFe/Pt | Pt/NiFe mixed bath | NiFe/Pt mixed bath |
|---|---|---|---|---|---|---|
| 1 | 1.09 | 1.02 | 1.01 | 1.01 | 1.00 | 1.01 |

As set out above, it was possible to confirm that the non-magnetic material and soft magnetic material layers in the configuration of fillers in micropores influenced the c-axis orientation of the hard magnetic material layer, too. It is estimated that after anodization, part of the Pt (001) surface of the base layer was oxidized or some oxides still remained and covering them with a material having the same crystalline structure improved the orientation in the subsequent layers. Furthermore, the same effects are obtained in other base layers.

Embodiment 12

This embodiment relates to a soft magnetic material layer placed below the base layer.

After a NiFe soft magnetic material layer with a film thickness of 2 μm was formed on a base layer MgO (001) plane of a Si substrate, a Pt base layer was formed and this Pt base layer was confirmed to be (001)-oriented in the direction perpendicular to the substrate from an X-ray diffraction. Furthermore, after forming a 30 nm Al—SiGe film using a sputtering method, anodization was carried out in a 7 mol/l aqueous solution of sulfuric acid at 20° C. with an applied voltage of 2 V to form a recording layer matrix. Furthermore, when its cross-section was observed using an FE-SEM (field emission type scanning electron microscope), the bottom of the micropores was uniform as in the case where there is no NiFe layer.

Furthermore, after forming FePt of an $L1_0$-ordered structure in micropores of the recording layer, DLC of the protective layer was formed into a film of 3 nm in thickness and a lubrication layer was formed. When recording is performed with the magnetic head contacting this medium, it is possible to confirm that the intensity of the magnetic field necessary for recording was 0.80 times that of the sample with no soft magnetic material layer below the Pt base layer and the soft magnetic material layer promotes concentration of magnetic flux.

Furthermore, PW50, a half-width of an area of transition between recording bits, was measured. As a result of a comparison with a case with no soft magnetic material layer, PW50 was 1.04, assuming that PW50 with the presence of a soft magnetic material layer is 1.0. Therefore, it is possible to confirm that the flux from the head does not expand from the soft magnetic material layer and the transition area also becomes sharper.

As set out above, it is appreciated that it is effective to insert a NiFe soft magnetic material below the base layer.

Embodiment 13

This embodiment relates to a configuration and a method for manufacturing a soft magnetic material layer of a perpendicular magnetic recording medium according to the present invention.

First, Pt of 20 nm in thickness and $Al_{50}Si_{50}$ layer (composition of Al: 50 atomic %, Si: 50 atomic %) of 300 nm in thickness were formed on a glass substrate. Pt of the base layer was formed on the glass substrate using a sputtering method.

The $Al_{50}Si_{50}$ layer was formed 300 nm in thickness on the glass substrate on which the base layer was formed using a magnetron sputtering method. The target used consists of six silicon chips of 15 mm per side placed on a circular aluminum target having a diameter of 4 inches (101.6 mm). As the sputtering conditions, an RF power supply was used with Ar flow rate: 50 sccm, discharge pressure: 0.7 Pa, power supplied: 1 kW. Furthermore, the substrate temperature was set to a room temperature (25° C.).

By the way, the aluminum target provided with six silicon chips was used as the target here, but the number of silicon chips is not limited to this and it changes depending on the sputtering condition and any number is acceptable if the composition of the AlSi layer is close to a predetermined content of silicon. Furthermore, the target is not limited to the one with silicon chips placed on an aluminum target, and the target can be the one with aluminum chips placed on a silicon target or a target with sintered silicon and aluminum may also be used.

Figure 5A:
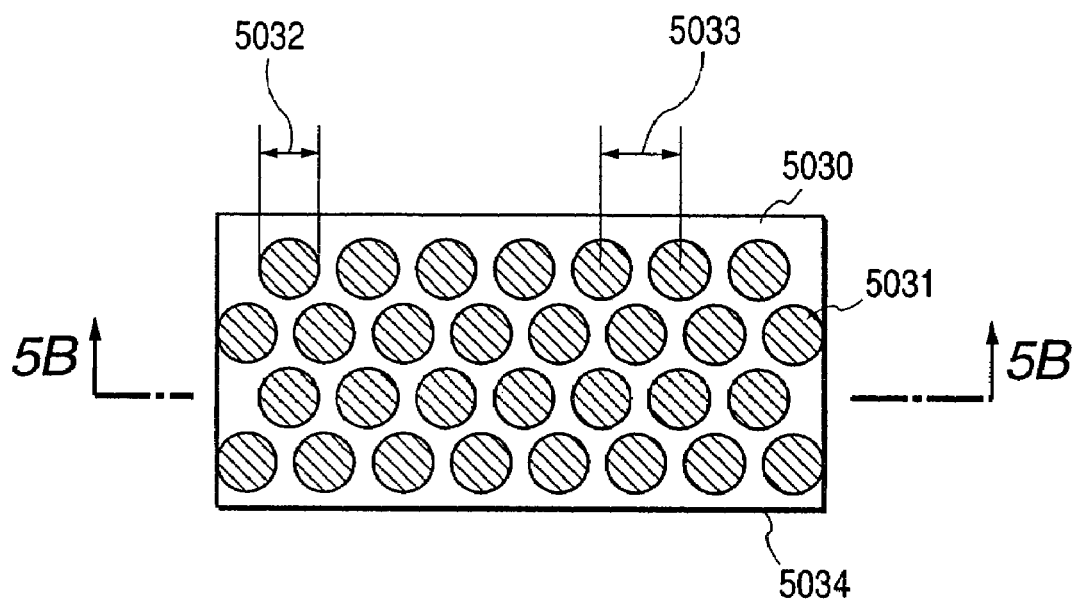
FIGS. 5A and 5B are schematic views of a structure applied to the present invention.
Figure 5B:
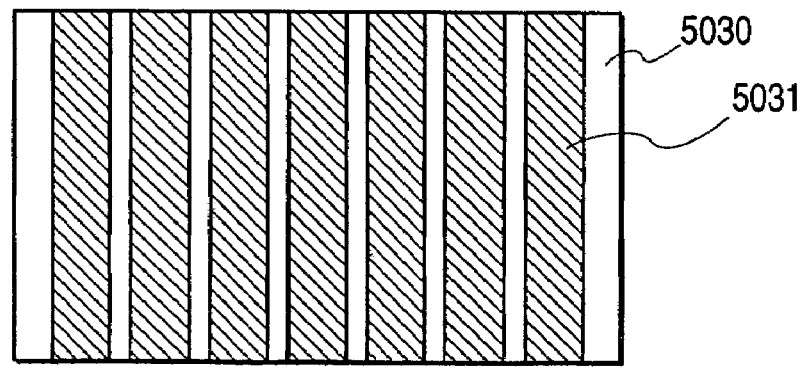

When this was observed using a scanning electron microscope (SEM), as shown in FIGS. 5A and 5B, it was confirmed that a film comprised of columnar aluminum portions 5031 and silicon portion 5030 was formed.

Furthermore, when the sample was observed using the SEM again after being immersed in phosphoric acid for a sufficient time, it was confirmed that columnar aluminum portions 5031 were transformed into micropores. Furthermore, it was also confirmed from an observation of the cross-section using the SEM that the micropores penetrated from the surface to Pt which constitutes the base layer. Furthermore, it was also confirmed that a similar procedure was also applicable to the formation of Pd, Cu and Ag base layers.

Then, a NiFe electrodeposition solution was prepared to fill the pores with a soft magnetic material. This is a mixture of nickel sulfate (II) septahydrate and iron sulfate (II) septahydrate at a ratio 1:1. Electrodeposition was carried out by applying a voltage of −1.0 V to the Ag/AgCl reference electrode at 24° C.

The overflowed soft magnetic material after the electrodeposition was polished and observed using the SEM and it was confirmed that all pores were filled with the soft magnetic material.

The diameter of the soft magnetic material was 6 nm and the distance was 9 nm.

Next, on top of the soft magnetic material layer, a base layer MgO (001) was formed, and on top of that, Pt (001), $L1_0$-ordered alloy of recording layer FePt, protective layer DLC (diamond-like carbon) and lubrication layer were further formed and a perpendicular magnetic recording medium was obtained in this way.

Embodiment 14

This embodiment relates to a configuration and another method of manufacturing the soft magnetic material layer of the perpendicular magnetic recording medium according to the present invention.

On a glass substrate, Pt of 20 nm in thickness, Ti of 1 nm in thickness and $Al_{50}Si_{50}$ of 300 nm in thickness were formed. Of course, as shown in FIGS. 5A and 5B, a film comprised of the columnar aluminum portions 5031 and silicon portion 5030 was formed.

Here, anodization was carried out using the above-described film as the anode and the aluminum plate as the cathode in an aqueous solution of sulfuric acid (concentration: 7 mol/l) at 20° C. while stirring it with a voltage of 5 V applied.

Figure 17:
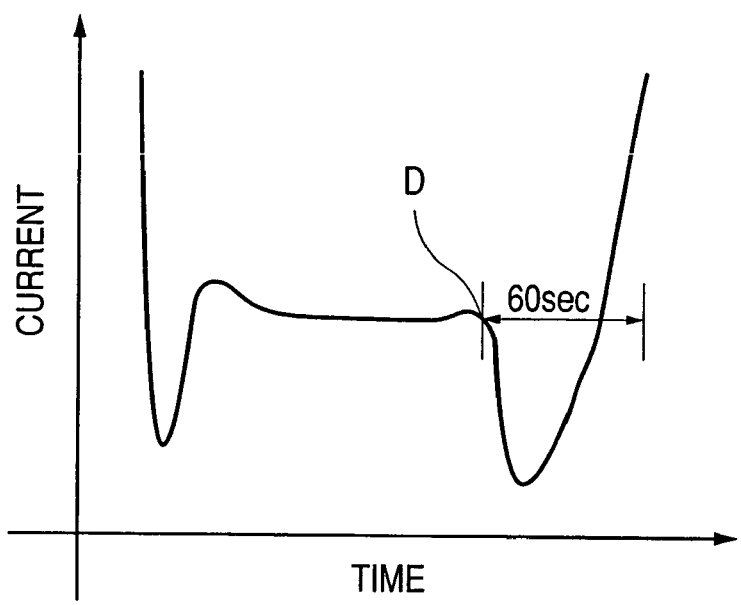
FIG. 17 illustrates an embodiment according to the present invention.

The anodization ended 60 seconds after a current value decrease starting point D shown in FIG. 17. Then, the film was immersed in a sodium hydroxide (concentration: 0.1 mol/l) for 30 minutes and fully washed with water. The formation of pores was confirmed by a subsequent SEM observation.

Furthermore, while the silicon portion 5030 remained in the case of Embodiment 13, the silicon portion 5030 was oxidized into silica in this embodiment. It was further confirmed that the diameter of pores was a little smaller than that of Embodiment 1 due to oxidation. Especially, it was confirmed through a SEM observation of the cross-section that pores penetrated up to the base layer Pt. Furthermore, it was confirmed that a similar procedure was also applicable to the formation of Pd, Cu and Ag base layers.

Then, a NiFe electrodeposition solution similar to that in Embodiment 13 was prepared to fill the pores with a soft magnetic material. Electrodeposition was carried out by applying a voltage of −1.0 V to the Ag/AgCl reference electrode at 24° C.

The overflowed soft magnetic material after the electrodeposition was polished and observed using the SEM and it was confirmed that all pores were filled with the soft magnetic material.

The diameter of the soft magnetic material was 5 nm and the distance was 9 nm.

Next, on top of the soft magnetic material layer, a base layer MgO (001) was formed, and on top of that, Pt (001), $L1_0$-ordered alloy of recording layer FePt, protective layer DLC (diamond-like carbon) and lubrication layer were further formed and a perpendicular magnetic recording medium was obtained in this way.

Embodiment 15

This embodiment relates to a distribution of a soft magnetic material of the soft magnetic material layer. Suppose the soft magnetic material layers created in Embodiments 13 and 14 as samples A and B, and that with the granular film with the silica shown in FIGS. 14A and 14B as a sample C. The film thicknesses of all soft magnetic material layers were unified into 300 nm.

By the way, sample C was created using a sputtering method.

Figure 18:
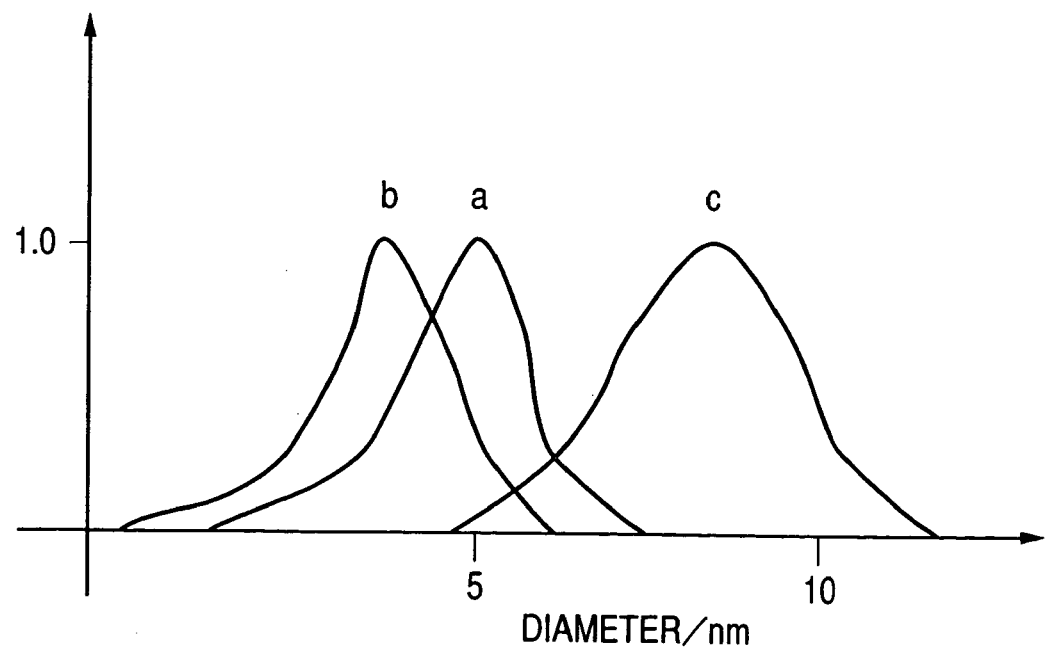
FIG. 18 illustrates an embodiment according to the present invention.

A diameter distribution of columnar soft magnetic materials of sample A is expressed by "a" in FIG. 18 centered on 5 nm. A diameter distribution of columnar soft magnetic materials of sample B is expressed by "b" in FIG. 18 centered on 4 nm. Furthermore, the diameter of a soft magnetic material grain of the granular film of sample C is expressed by "c" in FIG. 18 centered on 8 nm.

When these distributions are compared, the granular film in terms of volume is the cube of the diameter fluctuation and has a greater volume fluctuation than that of a columnar shape. Furthermore, with regard to perpendicular magnetic recording, as shown in FIGS. 14A and 14B, the granular film produces non-uniformity in magnetic flux paths in the sense that soft magnetic grains are distributed randomly also in the perpendicular direction perpendicular to the substrate or recording area.

Embodiment 16

This embodiment relates to noise during reproduction.

By adjusting the film thicknesses of samples A, B and C of Embodiment 15 to appropriate thicknesses and thereby making saturation magnetic flux density Bs constant, samples A', B' and C' were prepared. Furthermore, by converting the soft magnetic material layer to a continuous film, a sample D' was prepared. The thicknesses of the recording layers were united into the thickness 30 nm of CoCrPt.

These were written by a monopole head and their recording patterns were read by a GMR head. D' showed frequent spike noise, while A', B' and C' showed less spike noise. This may be attributable to the absence of domain walls.

Then, a half-width PW50 of the area of transition between recording bits of A', B' and C' was measured. Assuming PW50 of A' as 1.0, those of B' and C' were 0.98 and 1.04. This has something to do with non-uniformity due to a distribution of soft magnetic grains of the soft magnetic material layer.

As set out above, it is apparent that the diameter of the soft magnetic material of the soft magnetic material layer or non-uniformity of local Bs due to volume fluctuations hinders the reduction of noise.

Embodiment 17

This embodiment relates to a magnetic recording/reproduction apparatus.

As have been tried in the above-described Embodiments 15 and 16, the perpendicular magnetic recording medium of the present invention has by far smaller spike noise than that of conventional soft magnetic material layers and allows low noise recording/reproduction. Therefore, it is possible to form a magnetic recording apparatus by assembling the magnetic recording medium of the present invention into an apparatus made up of a magnetic recording medium drive section 8062, a magnetic head 8063, a magnetic head drive section 8064, and a signal processing section 8065 as shown in FIG. 8. However, with this embodiment, driving of the magnetic recording medium or driving of the magnetic head is not limited to only rotation or only sliding on a circumference, respectively.

Embodiment 18

This embodiment relates to an information processing apparatus.

Since the magnetic recording/reproduction apparatus shown in Embodiment 17 can input/output information, as shown in FIG. 9, it is possible to form an information processing apparatus with the magnetic recording/reproduction apparatus 9072, memory portion 9074, calculation section 9073, external input/output section 9076, power supply 9075 and wires 9077 for connecting these sections housed in the housing 9071.

What is claimed is:

1. A function device characterized by being obtained by incorporating a filling material into a porous body obtained by removing columnar members from a structure comprised of said columnar members and an area surrounding each of said columnar members, wherein said area is made of an amorphous Si, or an amorphous $Si_xGe_{1-x}(0<x<1)$, the average distance between said columnar members is 30 nm or less and wherein the length in the depth direction of columnar pores of said porous body is substantially equal to the thickness of the area surrounding said pores.

2. The function device according to claim 1, wherein said filling material includes a conductive material, a magnetic material, a luminescent material or a semiconductor material.

3. An article comprising a filling material and a porous body, wherein said porous body includes a plurality of columnar pores and said porous body is an amorphous Si, or an amorphous $Si_xGe_{1-x}(0<x,1)$, the average distance between centers of said pores is 30 nm or less and the length in the depth direction of the columnar pores is substantially equal to the thickness of an area surrounding the columnar pores.

4. The article according to claim 3, wherein said plurality of columnar pores have substantially no branch.

5. The article according to claim 3, wherein the average distance between centers of said pores is 20 nm or less.

6. The article according to claim 3, wherein the diameter of said columnar pore is 20 nm or less.

7. The article according to claim 3, wherein said pores have substantially the same depth direction.

8. The article according to claim 3, wherein said porous body includes aluminum.

9. The article according to claim 3, wherein said porous body is formed on a substrate and the depth direction of said columnar pores is almost perpendicular to said substrate.

10. The article according to claim 3, wherein said filling material is a conductive material, a magnetic material, a luminescent material or a semiconductor material.

11. An article comprising a plurality of columnar members and an area surrounding the members,
wherein said members include a conductive material, a semiconductor material, a magnetic material or a luminescent material,
wherein said area is an amorphous Si or an amorphous $Si_xGe_{1-x}(0<x<1)$,
wherein the average distance between centers of said columnar members is 30 nm or less,
and wherein the length in the depth direction of columnar pores of the columnar members is substantially equal to the thickness of the area surrounding the columnar members.

12. An article comprising a filling material and a porous body, wherein said porous body includes a plurality of columnar pores and said porous body is an amorphous Ge, the average distance between centers of said pores is 30 nm or less and the length in the depth direction of the columnar pores is substantially equal to the thickness of an area surrounding the columnar pores.

13. An article comprising a porous body and a filling material incorporated into said porous body, wherein said porous body includes a plurality of columnar pores and said porous body is an amorphous silicon oxide, amorphous $Si_xGe_{1-x}(0<x<1)$ oxide or an amorphous germanium oxide, and the average distance between centers of pores is 30 nm or less, said porous body contains aluminum and wherein the amount of aluminum contained in said porous body is 1 to 20 atomic %.

14. The article according to claim 12, wherein the filling material is a magnetic material.

15. A perpendicular magnetic recording medium comprising a filling material and a porous body, wherein said porous body includes a plurality of columnar pores and said porous body is an amorphous Si, or an amorphous $Si_xGe_{1-x}(0<x<1)$, the average distance between centers of said pores is 30 nm or less, and said filling material includes a magnetic material.

16. An article comprising a filling material and a porous body, wherein said porous body includes a plurality of columnar pores and said porous body is an amorphous Si, or an amorphous $Si_xGe_{1-x}(0<x<1)$, the average distance between centers of said pores is 30 nm or less and said porous body contains aluminum.

17. A perpendicular magnetic recording medium comprising a porous body and a filling material incorporated into said porous body, wherein said porous body includes a plurality of columnar pores and said porous body is an amorphous silicon oxide, amorphous $Si_xGe_{1-x}(0<x<1)$ oxide or an amorphous germanium oxide, and the average distance between centers of pores is 30 nm or less, said porous body contains aluminum, and said filling material includes a magnetic material.

18. The article according to claim 16, wherein the amount of aluminum present in said porous body is 1 to 20 atomic percent.

19. An article comprising a porous body and a filling material incorporated into said porous body, wherein said porous body includes a plurality of columnar pores and said porous body is an amorphous silicon oxide, amorphous $Si_xGe_{1-x}(0<x<1)$ oxide or an amorphous germanium oxide, the average distance between centers of pores is 30 nm or less, said porous body contains aluminum and the length in the depth direction of columnar pores of said porous body is substantially equal to the thickness of an area surrounding the pores.

* * * * *

UNITED STATES PATENT AND TRADEMARK OFFICE
CERTIFICATE OF CORRECTION

PATENT NO. : 7,081,303 B2
APPLICATION NO. : 10/656242
DATED : July 25, 2006
INVENTOR(S) : Nobuhiro Yasui et al.

It is certified that error appears in the above-identified patent and that said Letters Patent is hereby corrected as shown below:

ON TITLE PAGE AT ITEM (56) U.S. PATENT DOCUMENTS

"2002/0086185 A1 7/2002 Yasul et al. ..... 428/694 TS" should read --2002/0086185 A1 7/2002 Yasui et al. ..... 428/694 TS--.

ON TITLE PAGE AT ITEM (56) FOREIGN PATENT DOCUMENTS

"JP 01-101644 4/2001" should read --JP 2001-101644 4/2001--; and
"JP 01-273622 10/2001" should read --JP 2001-273622 10/2001--.

ON TITLE PAGE AT ITEM (56) OTHER PUBLICATIONS

After "Adams": "J, Mater." should read --J. Mater.--.

COLUMN 2

Line 64, "Ni)" should read --Ni).--.

COLUMN 24

Line 56, "$Al_x(Si_yGe_{1-y})_{1x}$," should read --$Al_x(Si_yGe_{1-y})_{1-x}$,--.

COLUMN 37

Line 2, "the-configuration" should read --the configuration--.

UNITED STATES PATENT AND TRADEMARK OFFICE
CERTIFICATE OF CORRECTION

PATENT NO. : 7,081,303 B2
APPLICATION NO. : 10/656242
DATED : July 25, 2006
INVENTOR(S) : Nobuhiro Yasui et al.

It is certified that error appears in the above-identified patent and that said Letters Patent is hereby corrected as shown below:

COLUMN 48

Line 49, "claim 12," should read --claim 13,--.

Signed and Sealed this

Thirtieth Day of January, 2007

JON W. DUDAS
*Director of the United States Patent and Trademark Office*